(12) United States Patent
Komori

(10) Patent No.: US 8,285,230 B2
(45) Date of Patent: Oct. 9, 2012

(54) AMPLIFYING CIRCUIT, SEMICONDUCTOR INTEGRATED CIRCUIT, WIRELESS TRANSMISSION SYSTEM, AND COMMUNICATION APPARATUS

(75) Inventor: Kenji Komori, Kanagawa (JP)

(73) Assignee: Sony Corporation, Tokyo (JP)

( * ) Notice: Subject to any disclaimer, the term of this patent is extended or adjusted under 35 U.S.C. 154(b) by 275 days.

(21) Appl. No.: 12/805,088

(22) Filed: Jul. 12, 2010

(65) Prior Publication Data
US 2011/0028089 A1  Feb. 3, 2011

(30) Foreign Application Priority Data

Jul. 28, 2009 (JP) ................. 2009-174964

(51) Int. Cl.
*H04B 1/04* (2006.01)
*H03F 3/04* (2006.01)
(52) U.S. Cl. ............... 455/127.3; 455/253.2; 330/250; 330/260
(58) Field of Classification Search .......... 455/234.1, 455/126, 39, 127.3, 253.2, 341; 330/250, 330/253, 260
See application file for complete search history.

(56) References Cited

U.S. PATENT DOCUMENTS

| | | | | | |
|---|---|---|---|---|---|
| 5,006,815 | A | * | 4/1991 | Klumperink et al. | 330/253 |
| 5,512,857 | A | * | 4/1996 | Koskowich | 330/252 |
| 5,959,491 | A | * | 9/1999 | Kang | 327/359 |
| 5,973,563 | A | * | 10/1999 | Seven | 330/265 |
| 6,784,741 | B1 | * | 8/2004 | Redman-White | 330/283 |

FOREIGN PATENT DOCUMENTS

| | | |
|---|---|---|
| JP | 2007-195189 | 8/2007 |
| JP | 2009-005137 | 1/2009 |

\* cited by examiner

*Primary Examiner* — Sonny Trinh
(74) *Attorney, Agent, or Firm* — Rader Fishman & Grauer, PLLC

(57) ABSTRACT

An amplifying circuit includes: an amplifying cell portion configured by cascade-connecting a plurality stage of amplifying cells each including a pair of N-type transistors differentially connected to each other, load resistors and a current source for generating an operating current, and each having a function of amplifying differential signals; a feedback portion configured to feed differential output signals from the amplifying cell in a rear stage side of the amplifying cell portion back to differential input terminals of the amplifying cell on a front stage side; and an input portion configured to supply differential input signals to input terminals in a first stage of the amplifying cell portion.

20 Claims, 9 Drawing Sheets

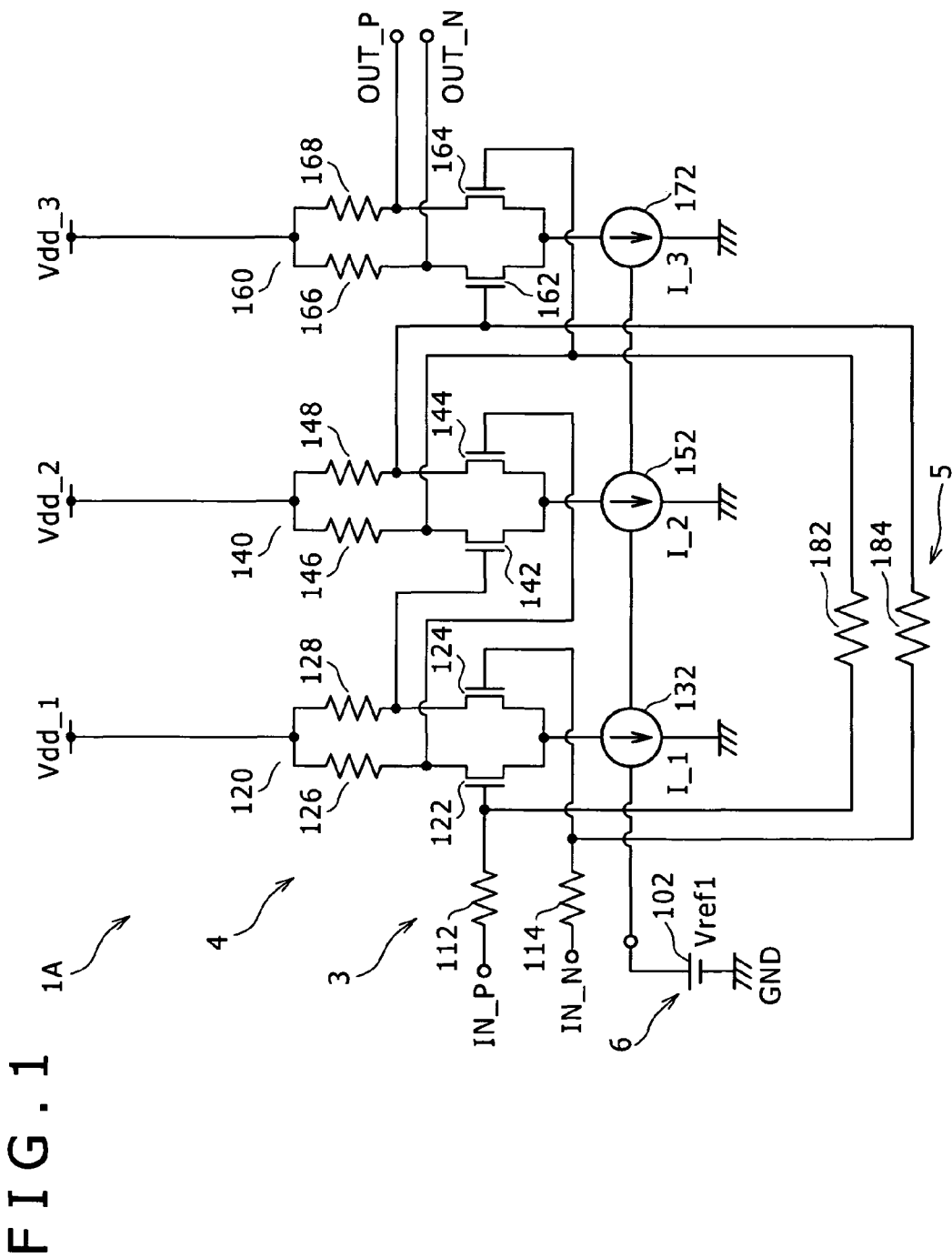
F I G . 1

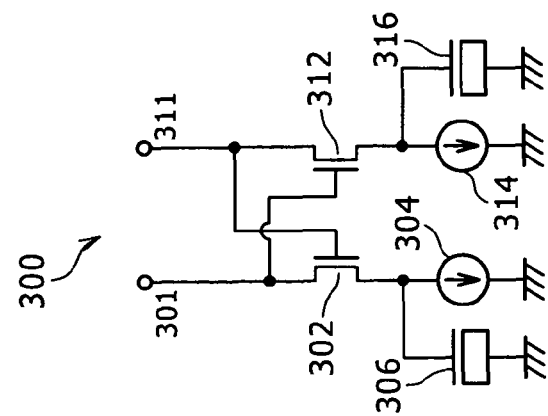
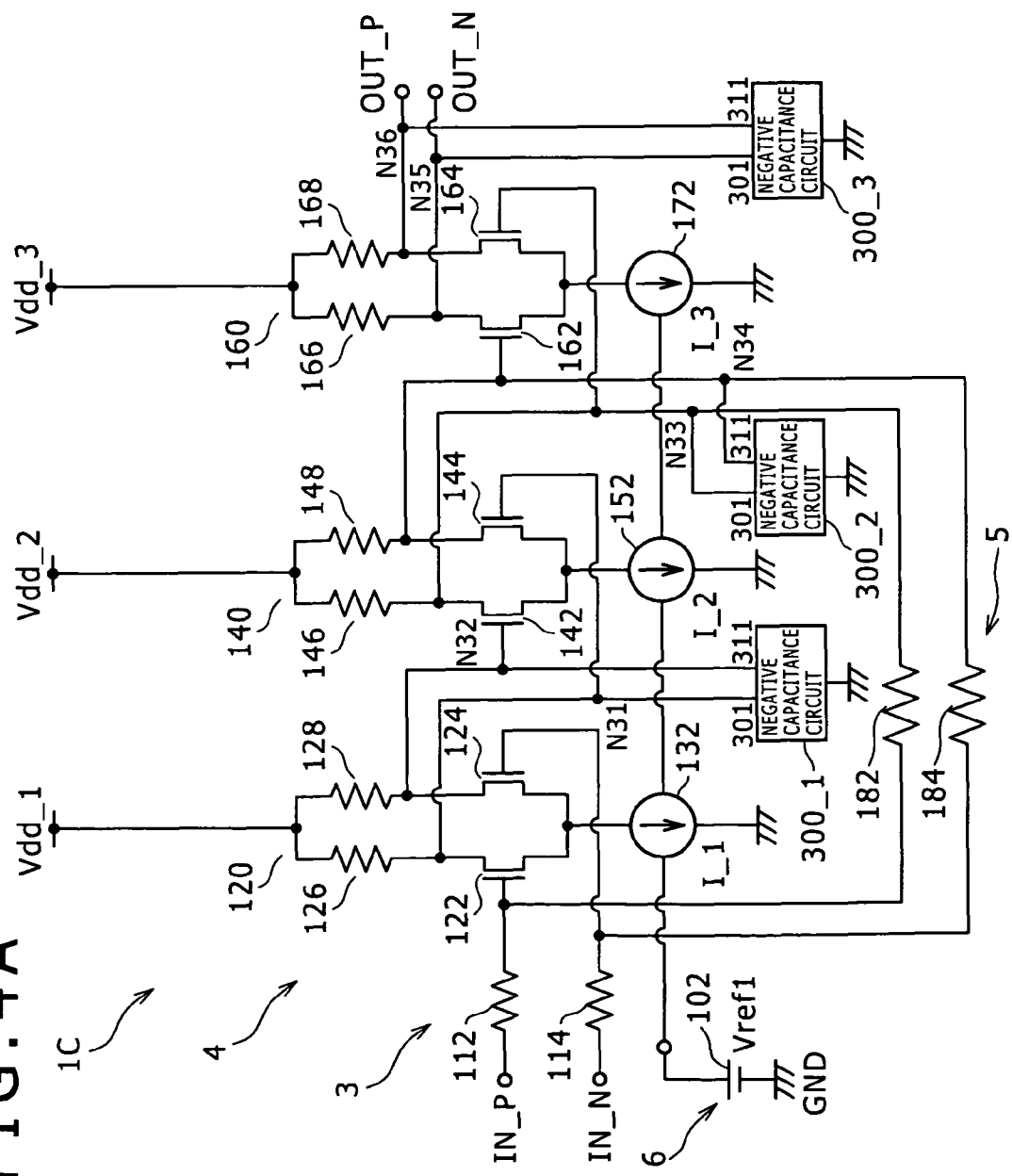
FIG. 4A
FIG. 4B

FIG. 6B
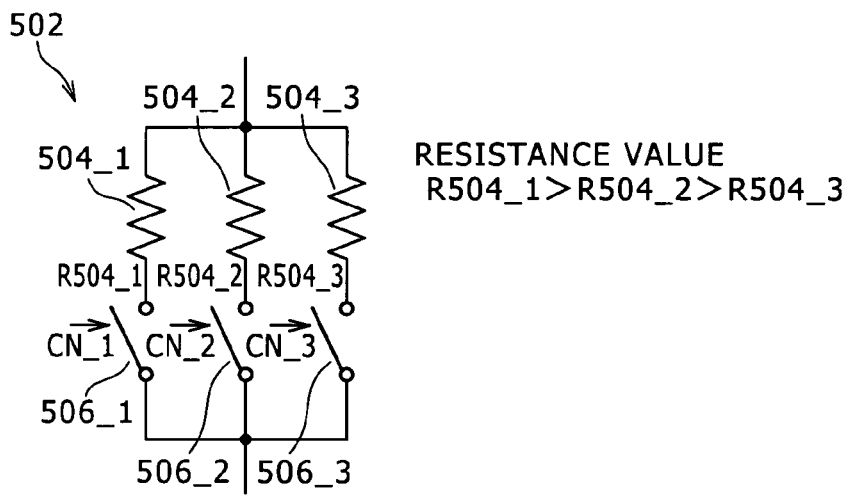
RESISTANCE VALUE
R504_1 > R504_2 > R504_3
FIG. 6C
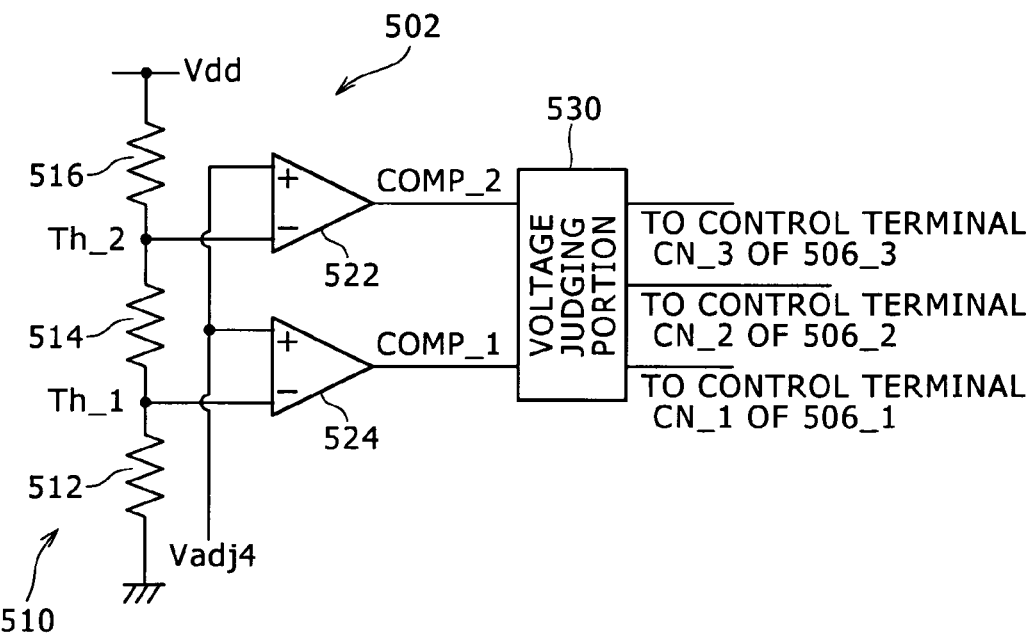
FIG. 6D
| COMP_1 | COMP_2 | VOLTAGE RELATIONSHIP | OPERATION OF VOLTAGE JUDGING PORTION |
|---|---|---|---|
| H | H | Th_2 ≦ Vadj4 | TURN ON ONLY 506_3 |
| H | L | Th_1 ≦ Vadj4 < Th_2 | TURN ON ONLY 506_2 |
| L | L | Vadj4 < Th_1 | TURN ON ONLY 506_1 |

AMPLIFYING CIRCUIT, SEMICONDUCTOR INTEGRATED CIRCUIT, WIRELESS TRANSMISSION SYSTEM, AND COMMUNICATION APPARATUS

BACKGROUND OF THE INVENTION

1. Field of the Invention

The present invention relates to an amplifying circuit, a semiconductor integrated circuit having the same mounted thereto, a wireless transmission system having the same mounted thereto, and a communication apparatus having the same mounted thereto. For example, the present invention relates to a high-frequency amplifying circuit which is applied to each of a communication apparatus on a transmission side and a communication apparatus on a reception side each of which operates in an Ultra Wide Band (UWB) or in a millimeter waveband.

2. Description of the Related Art

A broadband amplifying circuit which has flat amplification characteristics in a wide frequency range, for example, is proposed in Japanese Patent Laid-Open Nos. 2009-005137 and 2007-195189 (hereinafter referred to as Patent Documents 1 and 2) as an amplifying circuit which can respond to both requests for a broadband and a large gain.

For example, Patent Document 1 proposes a high-frequency circuit. This high-frequency circuit is configured as follows. That is to say, the high-frequency circuit includes a transistor, a load, a connection point, and a series circuit. In this case, the transistor has a source terminal a potential at which is fixed, and a gate terminal at which an input signal is received. The load is connected to a drain terminal of the transistor. The drain terminal of the transistor, and the load are connected to each other at the connection point. Also, in the series circuit, an inductor and a capacitor are connected in series with an output terminal of the high-frequency circuit. In addition, a band-pass filter having predetermined characteristics is composed of an output equivalent circuit expressing an output impedance of the transistor, the load, and the series circuit. In a word, a broadband amplifying circuit having a broadband of GHz or more is realized in the form of a load circuit using the inductor.

Patent Document 2 proposes a differential transimpedance amplifying circuit including a first operational amplifier, a second operational amplifier, a first feedback element, a second feedback element, a third feedback element, and a fourth feedback element. In this case, the first operational amplifier has a first inverting input terminal, a first non-inverting input terminal, a first inverting input terminal, and a first non-inverting output terminal. The second operational amplifier has a second inverting input terminal, a second non-inverting input terminal, a second inverting input terminal, and a second non-inverting output terminal. The second non-inverting output terminal is connected to the first inverting input terminal. The second non-inverting output terminal is connected to the first inverting input terminal. The first feedback element is connected to each of the first non-inverting input terminal and the first inverting input terminal. The second feedback element is connected to each of the first inverting input terminal and the first non-inverting input terminal. The third feedback element is connected to each of the second inverting input terminal and the first inverting output terminal. Also, the fourth feedback element is connected to each of the first non-inverting input terminal and the first non-inverting output terminal. In a word, a broadband amplifying circuit having a broadband of GHz or more is realized in the form of a resistance feedback type circuit.

SUMMARY OF THE INVENTION

However, the configuration of the high-frequency circuit described in Patent Document 1 involves a drawback due to the fact that the inductor is used in the load circuit (the details thereof will be described in a chapter of "DETAILED DESCRIPTION OF THE PREFERRED EMBODIMENTS"). In addition, in the configuration of the differential transimpedance amplifier circuit described in Patent Document 2, a circuit using a PMOS transistor is described, for example, with reference to FIGS. 26 to 29. Moreover, "this figure shows a first-order nested TIA700 of FIG. 7, and the TIA700 includes a first embodiment of an operational amplifier 710" is described in a paragraph 81. However, the differential transimpedance amplifier circuit is configured by using a plurality of transimpedance amplifiers using P-type transistors (such as a PMOS transistor or a PNP transistor) which is inferior in the frequency characteristics to an N-type transistor. Therefore, the differential transimpedance amplifier circuit involves a drawback in a widening of the broadband.

The present invention has been made in order to solve the problems described above, and it is therefore desirable to provide an amplifying circuit in which a satisfactory gain can be obtained over a broadband without using any of an inductor and a P-type transistor in a load, a semiconductor integrated circuit having the same mounted thereto, a wireless transmission system having the same mounted thereto, and a communication apparatus having the same mounted thereto.

In order to attain the desire described above, according to an embodiment of the present invention, there is provided an amplifying circuit including: an amplifying cell portion configured by cascade-connecting a plurality stage of amplifying cells each including a pair of N-type transistors differentially connected to each other, load resistors and a current source for generating an operating current, and each having a function of amplifying differential signals; a feedback portion configured to feed differential output signals from the amplifying cell in a rear stage side of the amplifying cell portion back to differential input terminals of the amplifying cell on a front stage side; and an input portion configured to supply differential input signals to input terminals in a first stage of the amplifying cell portion.

In a word, none of the inductor and the P-type transistor is used, but the load resistors are used as the load of the pair of N-type transistors which are differentially connected to each other in the amplifying cell. In addition thereto, the plurality stage of amplifying cells are cascade-connected to one another, thereby obtaining the large gain, and the differential output signals are fed from the output terminals of the amplifying cell on the rear stage side back to the input terminals of the amplifying cell on the front stage side, thereby configuring the negative feedback amplifying circuit.

According to another embodiment of the present invention, there is provided a semiconductor integrated circuit including: an amplifying cell portion configured by cascade-connecting a plurality stage of amplifying cells each including a pair of N-type transistors differentially connected to each other, load resistors and a current source for generating an operating current, and each having a function of amplifying differential signals; a feedback portion configured to feed differential output signals from the amplifying cell in a rear stage side of the amplifying cell portion back to differential input terminals of the amplifying cell on a front stage side; an input portion configured to supply differential input signals to input terminals in a first stage of the amplifying cell portion;

and a semiconductor substrate in which the amplifying cell portion, the feedback portion, and the input portion are formed.

In addition, each of the amplifying circuit and the semiconductor integrated circuit having the respective configurations as described above, for example, is applied as an amplifying portion (high-frequency amplifying circuit) in each of a communication apparatus on a transmission side and a communication apparatus on a reception side of a wireless transmission system for carrying out wireless transmission in a UWB or a millimeter waveband.

According to still another embodiment of the present invention, there is provided a wireless transmission system including: a first communication apparatus; a second communication apparatus; and a millimeter wave signal transmission path through which information is adapted to be transmitted between the first communication apparatus and the second communication apparatus in a millimeter waveband. Each of the first communication apparatus and the second communication apparatus has an amplifying circuit including: an amplifying cell portion configured by cascade-connecting a plurality stage of amplifying cells each including a pair of N-type transistors differentially connected to each other, load resistors and a current source for generating an operating current, and each having a function of amplifying differential signals; a feedback portion configured to feed differential output signals from the amplifying cell in a rear stage side of the amplifying cell portion back to differential input terminals of the amplifying cell on a front stage side; and an input portion configured to supply differential input signals to input terminals in a first stage of the amplifying cell portion. In the wireless transmission system, the first communication apparatus converts a signal as an object of transmission into a millimeter wave signal and amplifies the resulting millimeter wave signal in the amplifying circuit, and transmits the resulting millimeter wave signal thus amplified to the second communication apparatus through the millimeter wave signal transmission path, or the second communication apparatus receives the millimeter wave signal from the first communication apparatus through the millimeter wave signal transmission path and amplifies the millimeter wave signal in the amplifying circuit, and demodulates the millimeter wave signal thus amplified into the signal as the object of the transmission.

According to yet another embodiment of the present invention, there is provided a communication apparatus on a transmission side including: a signal generating portion on the transmission side configured to signal-process a signal as an object of transmission to generate a millimeter wave signal; an amplifying portion configured to amplify the millimeter wave signal generated in the signal generating portion on the transmission side; and a signal coupling portion on the transmission side configured to couple the millimeter wave signal amplified in the amplifying portion to a millimeter wave signal transmission path through which a millimeter wave signal is transmitted. The amplifying portion includes: an amplifying cell portion configured by cascade-connecting a plurality stage of amplifying cells each including a pair of N-type transistors differentially connected to each other, load resistors and a current source for generating an operating current, and each having a function of amplifying differential signals; a feedback portion configured to feed differential output signals from the amplifying cell in a rear stage side of the amplifying cell portion back to differential input terminals of the amplifying cell on a front stage side; and an input portion configured to supply the differential millimeter wave signal generated in the signal generating portion on the transmission side as an input signal to input terminals in a first stage of the amplifying cell portion.

According to a further embodiment of the present invention, there is provided a communication apparatus on a reception side including: a signal coupling portion on the reception side configured to receive a millimeter wave signal transmitted through a millimeter wave signal transmission path; an amplifying portion configured to amplify the millimeter wave signal received in the signal coupling portion on the reception side; and a signal generating portion on the reception side configured to signal-process the millimeter wave signal amplified in the amplifying portion to generate a signal as an object of transmission. The amplifying portion includes: an amplifying cell portion configured by cascade-connecting a plurality stage of amplifying cells each including a pair of N-type transistors differentially connected to each other, load resistors and a current source for generating an operating current, and each having a function of amplifying differential signals; a feedback portion configured to feed differential output signals from the amplifying cell in a rear stage side of the amplifying cell portion back to differential input terminals of the amplifying cell on a front stage side; and an input portion configured to supply the millimeter wave signal received in the signal coupling portion on the reception side as an input signal to input terminals in a first stage of the amplifying cell portion.

According to an even further embodiment of the present invention, there is provided a communication apparatus including: a transmission portion including a signal generating portion on a transmission side configured to signal-process a signal as an object of transmission to generate a transmission signal, and an amplifying portion on the transmission side configured to amplify the transmission signal generated in the signal generating portion on the transmission side; and/or a reception portion including an amplifying portion on a reception side configured to amplify a received signal, and a signal generating portion on the reception side configured to signal-process the received signal amplified in the amplifying portion on the reception side to generate the signal as the object of the transmission. The amplifying portion includes: an amplifying cell portion configured by cascade-connecting a plurality stage of amplifying cells each including a pair of N-type transistors differentially connected to each other, load resistors and a current source for generating an operating current, and each having a function of amplifying differential signals; a feedback portion configured to feed differential output signals from the amplifying cell in a rear stage side of the amplifying cell portion back to differential input terminals of the amplifying cell on a front stage side; and an input portion configured to supplying the differential millimeter wave signal generated in the signal generating portion on the transmission side as an input signal to input terminals in a first stage of the amplifying cell portion.

As set forth hereinabove, according to the present invention, it is possible to realize the amplifying circuit in which the large gain is realized in the broadband without using any of the inductor and the P-type transistor inferior in the frequency characteristics to the N-type transistor, the semiconductor integrated circuit having the same mounted thereto, the wireless transmission system having the same mounted thereto, and the communication apparatus having the same mounted thereto.

BRIEF DESCRIPTION OF THE DRAWINGS

FIG. 1 is a circuit diagram showing a configuration of an amplifying circuit according to a first embodiment of the present invention;

FIGS. 4A and 4B are respectively a circuit diagram showing a configuration of an amplifying circuit according to a third embodiment of the present invention, and a circuit diagram showing a configuration of a negative capacitance circuit in the amplifying circuit shown in FIG. 4A;

FIGS. 6B to 6D are respectively a circuit diagram showing a configuration of a functional portion on a variable resistor circuit side, a circuit diagram showing a configuration of a functional portion on a control circuit side, and a diagram explaining a relationship between a voltage relation and an operation of a voltage judging portion;

DETAILED DESCRIPTION OF THE PREFERRED EMBODIMENTS

Figure 2:
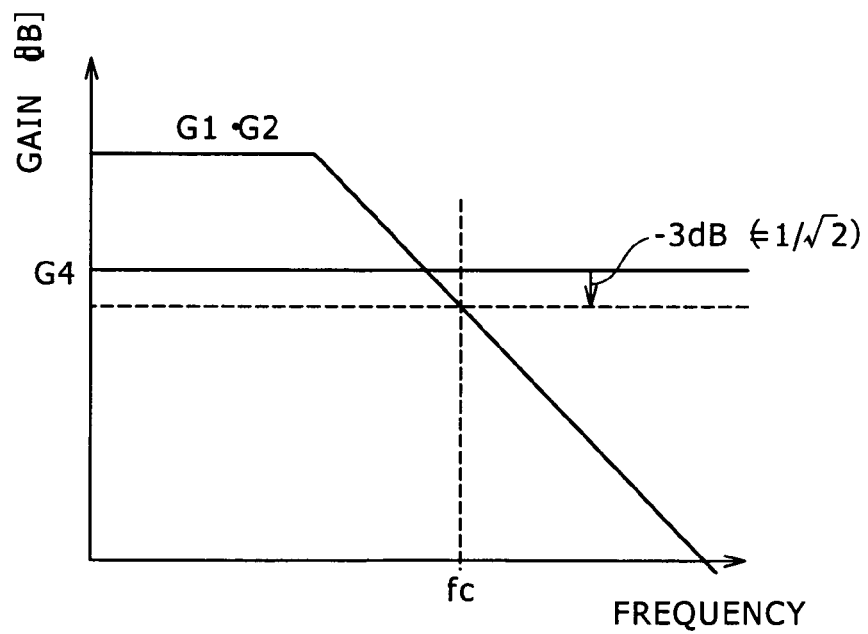
FIG. 2 is a graphical representation explaining a frequency band of the amplifying circuit according to the first embodiment of the present invention.

The preferred embodiments of the present invention will be described in detail hereinafter with reference to the accompanying drawings. When functional constituent elements are distinguished among embodiments, the functional constituent elements are described by adding reference symbols of upper case alphabetic characters such as A, B, C, . . . to original reference numerals, respectively. On the other hand, when the description is given without the especial distinction, the functional constituent elements are described with these reference symbols being omitted. This also applies to the drawings.

It is noted that the description will be given below in accordance with the following order.

1. Amplifying Circuit (First to Fifth Embodiments)
2. Semiconductor Integrated Circuit (Sixth Embodiment)
3. Wireless Transmission System (Seventh Embodiment)
4. Communication Apparatus on Transmission Side (Eighth Embodiment)
5. Communication Apparatus on Reception Side (Ninth Embodiment)
6. Communication Apparatus (Tenth Embodiment)
1. Amplifying Circuit
First Embodiment (Plurality Stage of Amplifying Cells+ Feedback Circuit)

FIGS. 1 and 2 are respectively a circuit diagram and a graphical representation explaining an amplifying circuit according to a first embodiment of the present invention. Here, FIG. 1 is the circuit diagram showing a configuration of the amplifying circuit according to the first embodiment of the present invention, and FIG. 2 is the graphical representation explaining a frequency band of the amplifying circuit according to the first embodiment of the present invention.

The amplifying circuit 1A of the first embodiment includes an input portion 3, an amplifying cell portion 4, a D.C. feedback path 5, and a reference power source portion 6. In this case, in the amplifying cell portion 4, a plurality stage of amplifying cells AS each having a function of amplifying a signal are cascade-connected to one another. Also, the reference power source portion 6 generates a reference voltage in accordance with which an operating current is regulated. The input portion 3, the amplifying cell portion 4, the D.C. feedback path 5, and the reference power source portion 6 (functional portions) are configured on the same semiconductor substrate, and are provided in the form of a semiconductor Integrated Circuit (IC).

In this case, the amplifying cell portion 4 is configured by cascade-connecting three stages of amplifying cells AS (120, 140 and 160) each configured as a differential amplifier to one another. The amplifying cell 160 in a final stage functions as an output amplifier as well. A plurality stage of amplifying cells AS are cascade-connected to one another, thereby obtaining a large gain, and thus a D.C. operating point is stably maintained in a certain degree of a range due to a D.C. negative feedback operation by the D.C. feedback portion 5. The wording "in a certain degree of a range" is stated in consideration of a point different from such a negative feedback circuit that an operating point of a certain portion agrees with a reference point. When only an A.C. gain is considered, the feedback may be carried out through capacitive coupling.

Here, for configuring each of the amplifying cells AS as the differential amplifier, the feature of the first embodiment is that the differential pair is configured by using N-type transistors, and none of an active load and an inductance cell is used as a load, but resistors are used as the load instead. Although any of an N-channel transistor (NMOS transistor) and an N-type bipolar junction transistor (NPN transistor) may be used as the N-type transistor, in the following description, the NMOS transistor is used as the N-type transistor.

It is expected that the P-type transistor (such as the P-channel transistor (PMOS transistor) or the PNP transistor) is used either in the differential pair or in the active load. However, the P-type transistor is not adopted herein because the P-type transistor is inferior in the high-frequency characteristics to the N-type transistor.

For example, it is expected that an amplifier is configured by using a plurality of transimpedance amplifiers each using the transistor inferior in the frequency characteristics. In this case, however, the amplifier thus configured is not suitable for an amplifier for a base-band signal corresponding to a broadband.

In addition, the use of the inductor involves a drawback that a band width is narrowed due to a Q value of the inductor to show band-pass (BPF) characteristics. Although it is expected that when the band of the BPF characteristics is equal to or wider than that in the original use application, there is no problem. However, there is a drawback that the performance is deteriorated due to the constant dispersion. In addition, when the amplifying circuit 1A is mounted in the form of the semiconductor Integrated Circuit (IC), the use of the inductor causes a drawback that a chip size becomes large. When the chip size is prioritized, it is also necessary to dispose the inductor outside the chip in some cases. On the other hand, the resistor is more easily formed in the semiconductor IC than the inductor, and the constant dispersion is less in the resistors.

Each of the amplifying cells AS (120, 140 and 160) includes a differential pair of NMOS transistors, resistors as a load, and a current source for generating an operating current for corresponding one of the amplifying cells 120, 140 and 160. For example, the amplifying cell 120 in an initial stage (in a first stage) includes a differential pair of NMOS transistors 122 and 124, load resistors 126 and 128 having one terminals which are connected to drain terminals of the NMOS transistors 122 and 124, respectively, and a current source 132 having one terminal which is commonly connected to source terminals of the NMOS transistors 122 and 124. The other terminals of the load resistors 126 and 128 are each connected to a power source Vdd_1 on a high potential side. The other terminal of the current source 132 is connected to the ground (GND). It is noted that a power source voltage Vss_1 on a low potential side may be used instead of using the ground.

The amplifying cell 140 in a second stage includes a differential pair of NMOS transistors 142 and 144, load resistors 146 and 148 having one terminals which are connected to drain terminals of the NMOS transistors 142 and 144, respectively, and a current source 152 having one terminal which is commonly connected to source terminals of the NMOS transistors 142 and 144. The other terminals of the load terminals 146 and 148 are each connected to a power source Vdd_2 on the high potential side. The other terminal of the current source 152 is connected to the ground (GND). It is noted that a power source voltage Vss_2 (preferably, Vss_1=Vss_2) on the low potential side may be used instead of using the ground (GND).

The amplifying cell 160 in the final stage (in a third stage) includes a differential pair of NMOS transistors 162 and 164, load resistors 166 and 168 having one terminals which are connected to drain terminals of the NMOS transistors 162 and 164, respectively, and a current source 172 having one terminal which is commonly connected to source terminals of the NMOS transistors 162 and 164. The other terminals of the load terminals 166 and 168 are each connected to a power source Vdd_3 on the high potential side. The other terminal of the current source 172 is connected to the ground (GND). It is noted that a power source voltage Vss_3 (preferably, Vss_1=Vss_2=Vss_3) on the low potential side may be used instead of using the ground (GND).

When the power source voltages Vss_1, Vss_2 and Vss_3 on the low potential side are used as the references on the low potential sides of the amplifying cells 120, 140 and 160, respectively, instead of using the ground, a power source voltage Vss on a lower potential side is also used as a reference on a lower potential side for each of portions in the second to fifth embodiments which will be described later instead of using the ground.

A reference power source portion 6 includes one reference voltage source 102 which is common to a plurality stage of amplifying cells AS (120, 140 and 160). Each of the current sources 132, 152 and 172 is connected to the reference voltage source 102, so that a reference potential Vref1 for setting of a current value is commonly supplied to the current sources 132, 152 and 172. The current sources 132, 152 and 172, supply D.C. bias currents I_1, I_2 and I_3 (operating currents) each corresponding to the reference potential Vref1 to the differential pair of NMOS transistors 122 and 124, the differential pair of NMOS transistors 142 and 144, and the differential pair of NMOS transistors 162 and 164, respectively. For the purpose of optimizing the operating points and the mutual conductances of the first to third stages, the D.C. bias current value is set every amplifying cell AS.

In this connection, the D.C. bias current value is divided into two parts every amplifying cell AS to be caused to flow through the two load resistors, thereby determining the operating point of the output signal. In addition thereto, the mutual conductance of the differential pair increases or decreases in accordance with the D.C. bias current. That is to say, the gain of the amplifying cell AS is determined in accordance with the set value of the D.C. bias current. In the case of this configuration, the operating point and the mutual conductance (that is, the gain) are not set independently of each other, but are set in conjunction with each other. In other words, when the operating point is optimized (for example, in a midpoint between the power source Vdd and the ground), the mutual conductance (gain) is determined in accordance with the D.C. bias current at that time. Contrary to this, when the D.C. bias current is set so as to obtain the necessary mutual conductance (gain), it cannot be said that the operating point is not necessarily optimal. When the operating point becomes improper, the distortion performance is necessarily determined. In particular, since the output amplitude is large in the final stage, a problem about a relationship between the operating point and the distortion performance remarkably appears.

The input portion 3 is provided on the input side (in a gate side) of the amplifying cell 120 in the initial stage. The input portion 3 has such a configuration as to have the resistors corresponding to the differential signals on the signal paths, respectively. That is to say, in the input portion 3, one terminals of input resistors 112 and 114 are connected to the gate terminals of the NMOS transistors 122 and 124 for the differential inputs in the amplifying cell 120, respectively. The other terminals of the input resistors 112 and 114 are connected to signal input terminals, that is, an input terminal IN_P for a clockwise signal, and an input terminal IN_N for an inversion signal of the amplifying circuit 1A, respectively, thereby supplying the differential signals, that is, a normal-phase input signal SP and a reverse-phase input signal SN to the gate terminals of the NMOS transistors 122 and 124 in the differential pair, respectively.

Differential output signals from the amplifying cell 120 in the initial stage become differential input signals to the amplifying cell 140 in the second stage, respectively. In this case, an output terminal (drain terminal) of the NMOS transistor 122 is connected to a gate terminal of the NMOS transistor 144, and an output terminal (drain terminal) of the NMOS transistor 124 is connected to a gate terminal of the NMOS transistor 142.

Likewise, differential output signals from the amplifying cell 140 in the second stage become differential input signals to the amplifying cell 160 in the third stages, respectively. In this case, an output terminal (drain terminal) of the NMOS transistor 142 is connected to a gate terminal of the NMOS transistor 164, and an output terminal (drain terminal) of the NMOS transistor 144 is connected to a gate terminal of the NMOS transistor 162. An output terminal (drain terminal) of the NMOS transistor 162 of the amplifying cell 160 in the third stage is connected to an output terminal (clockwise signal output terminal OUT_P) for a signal in phase with a signal inputted to an input terminal IN_P (clockwise signal input terminal) of the amplifying circuit 1A. An output terminal (drain terminal) of the NMOS transistor 164 of the amplifying cell 160 in the third stage is connected to an output terminal (inversion signal output terminal OUT_N) for a signal in phase with a signal inputted to an input terminal IN_N (inversion signal input terminal) of the amplifying circuit 1A.

The D.C. feedback portion 5 adopts such a configuration as to feed the output signals on the rear stage side back to the front stage side through D.C. coupling, thereby functioning so as to maintain the operating D.C. level in the amplifying cells AS between the front stage side and the rear stage side at a constant value. D.C. components are extracted from the output signals on the rear stage side to be D.C. fed back to the input terminals on the front stage side, thereby optimizing a D.C. bias for the output signals from the amplifying cell AS on the rear stage side. Thus, even when the output amplitude is increased, the distortion performance is improved.

For example, the D.C. feedback portion 5 adopts such a configuration as to have resistors corresponding to the differential signals, respectively, on the signal path. In the first embodiment, the D.C. feedback portion 5 adopts such a configuration that the differential output signals from the amplifying cell 140 in the second stage (the differential input signals to the amplifying cell 160 in the third stage) are fed back to the gate terminals of the NMOS transistors 122 and 124 of the amplifying cell 120 in the initial stage through feedback resistors 182 and 184, respectively.

It is noted that although in the first embodiment, the differential output signals from the amplifying cell 140 in the second stage are fed back to the amplifying cell 120 in the initial stage, the present invention is by no means limited thereto, and, for example, the differential outputs from the amplifying cell 160 in the final stage may be fed back to the amplifying cell 120 in the initial stage. However, in this case, the degree of freedom of setting for an output impedance of the amplifying circuit 1A is reduced. For example, although it is important for an output amplifier used either with the UWB or with the millimeter waveband to have a large gain and a high output power, it is also important for the output amplifier used either with the UWB or with the millimeter waveband to meet output matching in the band used. When the output matching is insufficiently met, for example, unnecessary reflection is caused in an external circuit in an antenna or the like, and thus the abnormal oscillation of a circuit may be generated. Therefore, it is necessary for the output amplifier used in a communication system in an ultra-broad band such as the UWB or the millimeter waveband to meet the output matching over the entire band.

In consideration of this respect, the first embodiment adopts such a configuration that when the D.C. feedback portion 5 is provided, the differential output signals from the amplifying cell in the stage (the second stage in the first embodiment) just before the final stage are fed back to the amplifying cell in the initial stage through the D.C. coupling, thereby making the final stage independent from the feedback loop.

Here, an amplification gain G1 of the amplifying cell 120 in the first stage is expressed by Expression (1):

$$G1 = \frac{gm1 \cdot R1}{1 + j2\pi f \cdot C1 \cdot R1} \quad (1)$$

where gm1 is a mutual conductance of each of the NMOS transistors 122 and 124, R1 is a resistance value of each of the load resistors 126 and 128, and C1 is a capacitance of each of the load capacitors. It is noted that the capacitance C1 of each of the load capacitors is represented in consideration of, for example, a wiring capacitance, and input capacitances of the NMOS transistors 142 and 144 which are connected in the form of impedances of the next stage (second stage) (a composite value of gate capacitances, gate-to-drain capacitances, gate-to-source capacitances, and the like). The amplification gain G1 becomes a function of a frequency because not only the pure resistances, but also the load capacitances C1 exist as the load impedance.

An amplification gain G2 of the amplifying cell 140 in the second stage is expressed by Expression (2):

$$G2 = \frac{gm2 \cdot R2}{1 + j2\pi f \cdot C2 \cdot R2} \quad (2)$$

where gm2 is a mutual conductance of each of the NMOS transistors 142 and 144, R2 is a resistance value of each of the load resistors 146 and 148, and C2 is a capacitance of each of the load capacitors. It is noted that the load capacitances C2 is represented in consideration of, for example, a wiring capacitance, and input capacitances of the NMOS transistors 162 and 164 which are connected in the form of impedances of the next stage (third stage) (a composite value of gate capacitances, gate-to-drain capacitances, gate-to-source capacitances, and the like). The amplification gain G2 becomes a function of the frequency because not only the pure resistances, but also the load capacitances C2 exist as the load impedance.

An amplification gain G3 of the amplifying cell 160 in the third stage is expressed by Expression (3):

$$G3 = \frac{gm3R3Zo}{R3 + Zo} \quad (3)$$

where gm3 is a mutual conductance of each of the NMOS transistors 162 and 164, R2 is a resistance value of each of the load resistors 146 and 148, and Zo is a load impedance.

An open gain of the amplifying circuit 1A of the first embodiment is expressed by a product of the amplification gains G1, G2 and G3 in the first to third stages. Since the amplifying circuit 1A of the first embodiment is provided with the D.C. feedback portion 5 for feeding the differential output signals from the amplifying cell 140 in the second stage back to the amplifying cell 120 in the first stage, the actual amplification gain does not become the open gain, but becomes a closed loop gain.

That is to say, the differential output signals from the amplifying cell 140 in the second stage are negatively fed back to the amplifying cell 120 in the first stage, and thus the negative feedback amplifying circuit is composed of all of the input portion 3, the amplifying cells 120 and 140 in the first and second stages, and the D.C. feedback portion 5. Here, an amplification gain G4 (closed loop gain) of the negative feedback amplifying circuit is expressed by Expression (4):

$$G4 = \frac{R5}{R4} \cdot \frac{G1 \cdot G2}{1 + G1 \cdot G2} \cong \frac{R5}{R4} \quad (4)$$
$$\because G1 \cdot G2 \gg 1$$

where R4 is a resistance value of each of the input resistors 112 and 114, and R5 is a resistance value of each of the feedback resistors 182 and 184.

When the amplification gains G1 and G2 in the first and second stages are each sufficiently large, the amplification gain G4 is determined in accordance with a ratio of the resistance value R5 of each of the feedback resistors 182 and 184 to the resistance value R4 of each of the input resistors 112 and 114.

Since not only the pure resistances, but also the load capacitors C1 and C2 exist as the load impedance in the amplifying cells 120 and 140, respectively, as previously stated, each of the amplification gains G1 and G2 becomes the function of the frequency, f. Thus, the closed loop gain G4 of the negative feedback amplifying circuit also has the frequency characteristics.

For example, if a frequency band when no feedback is carried out for each of the amplifying cells 120 and 140 (referred to as a single amplifiers) is regulated by a cut-off frequency, f1 (a frequency of a 3 dB-down value), the cut-off frequency, f1, when C1=C2, R1=R2, and gm1=gm2 is expressed by Expression (5):

$$f1 = \frac{1}{2\pi \cdot C1 \cdot R1} \quad (5)$$

On the other hand, if a frequency band of the negative feedback amplifying circuit is regulated by a cut-off frequency, fc (a frequency of a 3 dB-down value), the cut-off frequency, fc, when C1=C2, R1=R2, and gm1=gm2 is expressed by Expression (6) because of $(1/\sqrt{2}) \times G4 = G1 \times G2$:

$$\frac{1}{\sqrt{2}} \frac{R5}{R4} = \frac{(gm1 \cdot R1)^2}{1 + (2\pi fc \cdot C1 \cdot R1)^2} \quad (6)$$

$$\therefore fc = \frac{1}{2\pi \cdot C1 \cdot R1} \sqrt{\sqrt{2} \frac{R4}{R5}(gm1 \cdot R1)^2 - 1} =$$

$$\frac{1}{2\pi \cdot C1 \cdot R1} \sqrt{\sqrt{2} \frac{(G1 \cdot G2)}{G4} - 1}$$

As understood from Expressions (1) to (6), the amplification gains G1 and G2 of the amplifying cells 120 and 140 in the first and second stages are each increased with respect to the closed loop gain G4, whereby the frequency band (the cut-off frequency fc) of the negative feedback amplifying circuit can be widened with respect to the frequency band (the cut-off frequency f1) in the single amplifier expressed by Expression (5). Although being dependent on the set values of the capacitance values C1 and C2 of the load capacitors, the resistance values R1 and R2 of the load resistors, and the mutual conductances gm1 and gm2, for example, the cut-off frequency fc can also be set at about several gigahertz.

Although in the first embodiment, the negative feedback amplifying circuit is composed of the two stages of the amplifying cells AS, when the number of stages is further increased, the gain which can be realized in the same frequency band can be increased, and when the gain is held at the same level, the frequency band can be widened.

As described above, the amplifying circuit 1A of the first embodiment is configured in such a way that a plurality of amplifying cells AS each including a pair of NMOS transistors differentially connected to each other and the two load resistors are cascade-connected to one another, and the differential output signals from the amplifying cell in the rear stage side are D.C.-fed back to the amplifying cell in the front stage side. As a result, the large gain can be realized in the wide band of Direct Current (D.C.) to several gigahertz without using any of the inductance cell and the PMOS transistor inferior in the frequency characteristics to the NMOS transistor. By configuring the amplifying circuit 1A without using the inductance cell, the chip area can be reduced as compared with the case where the inductance cell is used. Since all the circuit elements can be configured on the chip, including the current sources 132, 152 and 172, any of peripheral elements is unnecessary, and thus the cost can also be reduced.

Although it is expected to adopt a complementary amplifying circuit in which the NMOS transistor is replaced with the PMOS transistor, the PMOS transistor is inferior in the frequency characteristics to the NMOS transistor in the first place, and thus the cut-off frequency thereof is reduced. The amplifying circuit 1A is configured without using the PMOS transistor inferior in the frequency characteristics to the NMOS transistor, whereby the band can be widened as compared with the amplifying circuit using the PMOS transistor.

In addition, in the amplifying circuit 1A, in the D.C. feedback portion 5, the differential output signals from the amplifying cell in the stage right before the final stage are fed back to the amplifying cell in the first stage through the D.C. coupling, thereby making the amplifying cell in the final stage independent of the feedback loop. As a result, the output impedance of the amplifying circuit 1A can be set independently of the feedback loop, and thus the degree of freedom of the design for a relationship with the load connected to the subsequent stage can be increased.

Second Embodiment (First Embodiment+D.C. Operating Point Stabilizing Circuit)

Figure 3:
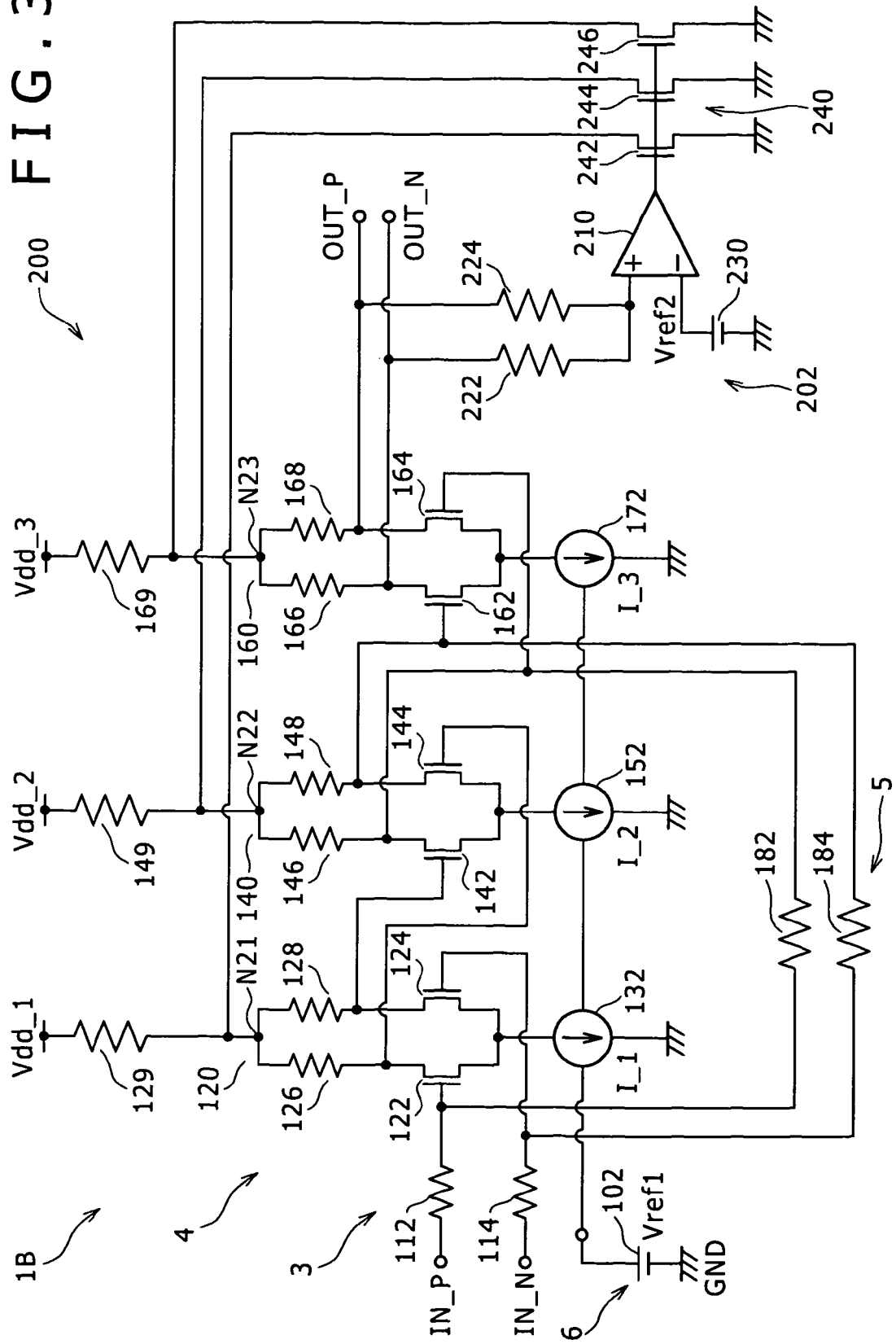
FIG. 3 is a circuit diagram showing a configuration of an amplifying circuit according to a second embodiment of the present invention.

FIG. 3 is a circuit diagram showing a configuration of an amplifying circuit according to a second embodiment of the present invention. The feature of the amplifying circuit 1B according to the second embodiment of the present invention is to include an operating point voltage stabilizing circuit 200 (in other words, a D.C. operating point change suppressing circuit) based on the amplifying circuit 1A of the first embodiment. The operating point voltage stabilizing circuit 200 monitors an operating point voltages of the differential output signals from the amplifying cell AS, and carries out control in such a way that the operating point voltages of the amplifying cells AS are each held constant based on the monitoring result. Hereinafter, the amplifying circuit 1B of the second embodiment will be described by focusing on a difference between the first embodiment and the second embodiment.

In the amplifying circuit 1B of the second embodiment, firstly, in each of the amplifying cells AS (120, 140 and 160) in the first to third stages, the load resistors are not directly connected to the power sources Vdd, respectively, but are connected to the power sources Vdd through D.C. operating point adjusting elements, respectively. In the second embodiment, a resistor is used as the D.C. operating point adjusting element. For example, the amplifying cell 120 in the first stage includes the D.C. operating point adjusting element 129 composed of the resistor disposed between a connection point (a node N21) between the resistors 126 and 128, and the power source Vdd_1. The amplifying cell 140 in the second stage includes the D.C. operating point adjusting element 149 composed of the resistor disposed between a connection point (a node N22) between the resistors 146 and 148, and the power source Vdd_2. Also, the amplifying cell 160 in the final stage includes the D.C. operating point adjusting element 169 composed of the resistor disposed between a connection point (a node N23) between the resistors 166 and 168, and the power source Vdd_3.

In addition, the amplifying circuit 1B of the second embodiment includes a D.C. operating point controlling portion 202 and a current driving portion 240 in a stage next to the final stage. The functional portions including the D.C. operating point controlling portion 202 and the current driving portion 240 are configured on the same semiconductor substrate and are provided in the form of a semiconductor Integrated Circuit (IC).

The D.C. operating point controlling portion 202 includes a differential amplifying circuit 210 (which may also be a comparator), monitoring elements 222 and 224, and a reference voltage source 230 for generating a reference potential Vref2. In the second embodiment, resistors are used as the monitoring elements 222 and 224, respectively. The differential amplifying circuit 210 compares each of the operating point voltages of the differential output signals, from the amplifying cell AS (the amplifying cell 160 in the second embodiment), which are monitored by the mounting elements 222 and 224, respectively, with the reference potential Vref2 generated by the reference voltage source 230.

The current driving portion 240 causes D.C. currents to flow through the D.C. operating point adjusting elements 129, 149 and 169 of the amplifying cells 120, 140 and 160 in the first to third stages, respectively, in accordance with an output signal from the differential amplifying circuit 210. From this reason, the current driving portion 240 includes driving transistors 242, 244 and 246 corresponding to the D.C. operating point adjusting elements 129, 149 and 169 of the amplifying cells 120, 140 and 160 in the first to third stages, respectively.

The D.C. operating point adjusting elements 129, 149 and 169 of the amplifying cells 120, 140 and 160 in the first to third stages, the D.C. operating point controlling portion 202, and the current driving portion 240 monitor the operating point voltages of the differential output signals from the amplifying cells 120, 140 and 160 in the first to third stages, respectively. Also, the operating point voltage stabilizing circuit 200 is configured which carries out the control in such a way that the operating point voltages are each held constant in accordance with the monitoring results.

It is noted that it is expected that the D.C. operating point controlling portions 202 for monitoring the D.C. potential levels (operating point voltages) are provided so as to correspond to the differential output signals from the amplifying cells AS (120, 140 and 160) in the first to third stages, respectively. In this case, however, the circuit is scaled up. In order to cope with such a situation, the second embodiment adopts a configuration that the D.C. opening point controlling portion 202 is provided only in the stage next to the final stage so that each of the differential output signals from the final stage having a less margin for the D.C. bias change of the output signals is made a monitoring point, and the negative feedback control is carried out in such a way that not only the D.C. levels of the differential output signals from the amplifying cell in the final stage, but also the D.C. levels of the differential output signals from the amplifying cells in the remaining stages are each held constant in accordance with a control signal based on the monitoring results.

One terminal of the monitoring element 222 is connected to the drain terminal (that is, the clockwise signal output terminal OUT_P) of the NMOS transistor 162 in the amplifying cell 160 in the final stage. One terminal of the monitoring element 224 is connected to the drain terminal (that is, the inversion signal output terminal OUT_N) of the NMOS transistor 164 in the amplifying cell 160 in the final stage. The reason that each of the monitoring elements 222 and 224 is connected to the node N23 of the amplifying cell 160 in the final stage is because a respect that the output amplitude is large in the amplifying cell 160 in the final stage, and thus a problem about a relationship between the operating point and the distortion performance remarkably appears is taken into consideration.

The other terminals of the monitoring elements 222 and 224 are commonly connected to one input terminal (a non-inverting input terminal (+) in this embodiment) of the differential amplifying circuit 210. The other input terminal (an inverting input terminal (−) in this embodiment) of the differential amplifying circuit 210 is connected to the reference voltage source 230, and thus a reference potential Vref2 is supplied to the inverting input terminal (−) of the differential amplifying circuit 210. The reference potential Vref2 shows one-to-one correspondence with each of the operating point potentials Vo of the output signals, and, for example, has the same value as a midpoint potential between the power source Vdd and the ground (or the power source voltage Vss on the low potential side).

NMOS transistors are used as the driving transistors 242, 244 and 246 in the second embodiment, respectively. Gate terminals of the driving transistors 242, 244 and 246 in the second embodiment composed of the NMOS transistors, respectively, are commonly connected to an output terminal of the differential amplifier 210, and source terminals of the driving transistors 242, 244 and 246 are each grounded. A drain terminal of the driving transistor 242 is connected to the node N21 of the amplifying cell 120 in the first stage. A drain terminal of the driving transistor 244 is connected to the node N22 of the amplifying cell 140 in the second stage. Also, a drain terminal of the driving transistor 246 is connected to the node N23 of the amplifying cell 160 in the final stage.

The differential amplifying circuit 210 compares each of the D.C. levels (in a word, each of the operating point potentials Vo in the final stage) at the node N23, of the amplifying cell 160 in the final stage, which are detected through the monitoring elements 222 and 224, respectively, with the reference potential Vref2 set by the reference voltage source 230. Thus, the differential amplifying circuit 210 carries out the negative feedback control through the driving transistors 242, 244 and 246 so that each of the operating point potentials Vo and the reference potential Vref2 agree with each other.

For example, when a relationship of each of the operating point potentials Vo>the reference potential Vref2 is established, an output voltage from the differential amplifying circuit 210 increases and drain currents of the driving transistors 242, 244 and 246 each increase. Therefore, currents caused to flow through the D.C. operating point adjusting elements 129, 149 and 169, respectively, each increase. As a result, voltages developed at the nodes N21, N22 and N23, respectively, each drop, and each of the operating point potentials Vo (in a word, the voltage at the clockwise signal output terminal OUT_P and the voltage at the inversion signal output terminal OUT_N) of the amplifying cell 160 in the final stage each drop. Thus, each of the operating point potentials Vo is controlled so as to approach the reference potential Vref2.

Contrary to this, when a relationship of each of the operating point potentials Vo<the reference potential Vref2 is established, the output voltage from the differential amplifying circuit 210 decreases and the drain currents of the driving transistors 242, 244 and 246 each decrease. Therefore, the currents caused to flow through the D.C. operating point adjusting elements 129, 149 and 169, respectively, each decrease. As a result, the voltages developed at the nodes N21, N22 and N23, respectively, each rise, and each of the operating point potentials Vo (in a word, the voltage at the clockwise signal output terminal OUT_P and the voltage at the inversion signal output terminal OUT_N) of the amplifying cell 160 in the final stage each rise. Thus, each of the operating point potentials Vo is controlled so as to approach the reference potential Vref2.

In a word, the D.C. operating point controlling portion 202 carries out the control in such a way that each of the operating point potentials Vo agrees with the reference potential Vref2. Therefore, with the amplifying circuit 1B of the second embodiment, each of the operating points, and the mutual conductance (in a word, the gain) can be set independently of each other. For example, when the D.C. bias current is set by the reference voltage source 102 so as to obtain the necessary mutual conductance (gain), the potentials at the nodes N21, N22 and N23 are set in accordance with the setting for the D.C. bias current. In this case, it cannot be necessarily said that each of the opening point potentials Vo is optimal. However, the D.C. operating point controlling portion 202 detects the potentials at the nodes N21, N22 and N23, and carries out the control in such a way that each of the operating point potentials Vo agrees with the reference potential Vref2.

The amplifying circuit 1B extracts the D.C. components from the output signals and feeds the D.C. components thus extracted in the form of the currents to the connection points (the nodes N21, N22 and N23) of the load resistors 126 and 128, the load resistors 146 and 148, and the load resistors 166 and 168, respectively. Thus, the negative feedback control is carried out in such a way that each of the operating points Vo is held at a constant value (an optimal value: a value agreeing with the reference potential Vref2 in the second embodiment). For this reason, it is possible to realize the amplifier in which the distortion performance can be improved even when the D.C. biases for the output signals are optimized to increase the output amplitude while the frequency characteristics are held at the same level as that in the frequency characteristics of the amplifying circuit 1A of the first embodiment.

It is noted that although the NMOS transistors are used as the driving transistors 242, 244 and 246, respectively, in the second embodiment, PMOS transistors may be used as the driving transistors 242, 244 and 246, respectively, instead because the D.C. operating point stabilizing processing does not require the high-frequency characteristics such as the signal amplification. In this case, however, the amplifying circuit 1B is configured in consideration of a respect that the use of the PMOS transistors results in an operation which is complementary to that of the NMOS transistor.

For example, the source terminals of the driving transistors 242, 244 and 246 composed of the PMOS transistors are connected to the power sources Vdd, respectively, and the drain terminals thereof are connected to the nodes N21, N22 and N23, respectively. When the output voltage from the differential amplifying circuit 210 is reduced, the drain currents of the driving transistors 242, 244 and 246 are each increased, while when the output voltage from the differential amplifying circuit 210 is increased, the drain currents of the driving transistors 242, 244 and 246 are each decreased. Therefore, one terminals of the monitoring elements 222 and 224 are each connected to the inverting input terminal of the differential amplifying circuit 210, and the reference voltage source 230 is connected to the non-inverting input terminal of the differential amplifying circuit 210.

Third Embodiment (First Embodiment+Load Parasitic Capacitance Correcting Circuit)

FIGS. 4A and 4B are respectively a circuit diagram showing a configuration of an amplifying circuit according to a third embodiment of the present invention, and a circuit diagram showing a configuration of a negative capacitance circuit in the amplifying circuit shown in FIG. 4A. The feature of the amplifying circuit 1C of the third embodiment is to include parasitic capacitance correcting circuits for correcting (canceling) load capacitances which occur parasitically on the output sides of the amplifying cells AS based on the amplifying circuit 1A of the first embodiment. Hereinafter, a description will be given by focusing on a difference from the amplifying circuit 1A of the first embodiment.

As shown in FIG. 4A, the amplifying circuit 1C of the third embodiment includes negative capacitance circuits 300 each functioning as the parasitic capacitance correcting circuit on the output sides of the amplifying cells AS (the amplifying cells 120, 140 and 160) in the first to third stages, respectively. The functional portions including the negative capacitance circuits 300 are configured on the same semiconductor substrate and are provided in the form of the semiconductor IC.

Each of the negative capacitance circuits 300 has a function of carrying out an operation for equivalently canceling a parasitic capacitance (including a transistor capacitance and a wiring capacitance in the next stage) equivalently connected in parallel with the load resistors of the corresponding one of the amplifying cells AS (120, 140 and 160) in the first to third stages, thereby widening the frequency band of the corresponding one of the amplifying cells AS.

In the negative capacitance circuit 300_1 connected to the output side of the amplifying cell 120 in the first stage, a first output node 301 is connected to the drain terminal of the NMOS transistor 122, and a second output node 311 is connected to the drain terminal of the NMOS transistor 122. In the negative capacitance circuit 300_2 connected to the output side of the amplifying cell 140 in the second stage, the first output node 301 is connected to the drain terminal of the NMOS transistor 142, and the second output node 311 is connected to the drain terminal of the NMOS transistor 144. Also, in the negative capacitance circuit 300_3 connected to the output side of the amplifying cell 160 in the third stage, the first output node 301 is connected to the drain terminal of the NMOS transistor 162, and the second output node 311 is connected to the drain terminal of the NMOS transistor 164.

As shown in FIG. 4B, the negative capacitance circuit 300 includes a pair of NMOS transistors 302 and 312, current sources 304 and 314 for generating operating currents for the NMOS transistors 302 and 312, and correcting capacitors 306 and 316. One terminals of the current sources 304 and 314, and one terminals of the correcting capacitors 306 and 316 are connected to the source terminals (the other terminals) of the cross-coupled NMOS transistors 302 and 312, respectively. In this case, in the cross-coupled NMOS transistors 302 and 312, the gate terminal (control input terminal) of the NMOS transistor 302 is connected to the drain terminal (one terminal) of the NMOS transistor 312, and the drain terminal of the NMOS transistor 302 is connected to the gate terminal of the NMOS transistor 312. The other terminals of the current sources 304 and 314, and the other terminals of the correcting capacitors 306 and 316 are all grounded.

Capacitance value of each of the correcting capacitors 306 and 316 is set as such a value as to correspond to the parasitic capacitance of the amplifying cell AS. Each of the correcting capacitors 306 and 316 may be made in the form of a capacitor between a metal and a metal in which electrodes are disposed so as to be opposite to each other, or may be made by utilizing a parasitic capacitance (for example, a capacitance between a gate and a drain/source) of a MOS transistor.

The negative capacitance circuit 300 causes a current Io ($=V_{in} \times j\omega Co$) to flow into each of the correcting capacitors 306 and 316 (each of capacitance values is taken to be Co) by using a signal voltage Vin supplied to each of the NMOS transistors 302 and 312. The negative capacitance circuit 300 feeds the currents generated on the drain sides of the NMOS transistors 302 and 312 in accordance with the current. Io back to the reverse polarity sides, thereby operating as if the negative capacitance seemingly exists in the output terminal of the amplifying cell AS. As a result, the influences of the parasitic capacitances equivalently connected in parallel with the respective negative resistors of the amplifying cells AS (120, 140 and 160) in the respective stages are canceled, thereby widening the frequency bands of the amplifying cells AS (120, 140 and 160).

It should be noted that although in the amplifying circuit 1C of the third embodiment, the description, has been given with respect to the configuration in which the negative capacitance circuits 300 are added to the amplifying circuit 1A of the first embodiment, the present invention is by no means limited thereto, and thus the negative capacitance circuits 300 can also be applied to the second embodiment or to fourth and fifth embodiments which will be described later.

Fourth Embodiment (Second Embodiment+Gain Adjusting Circuit)

Figure 5:
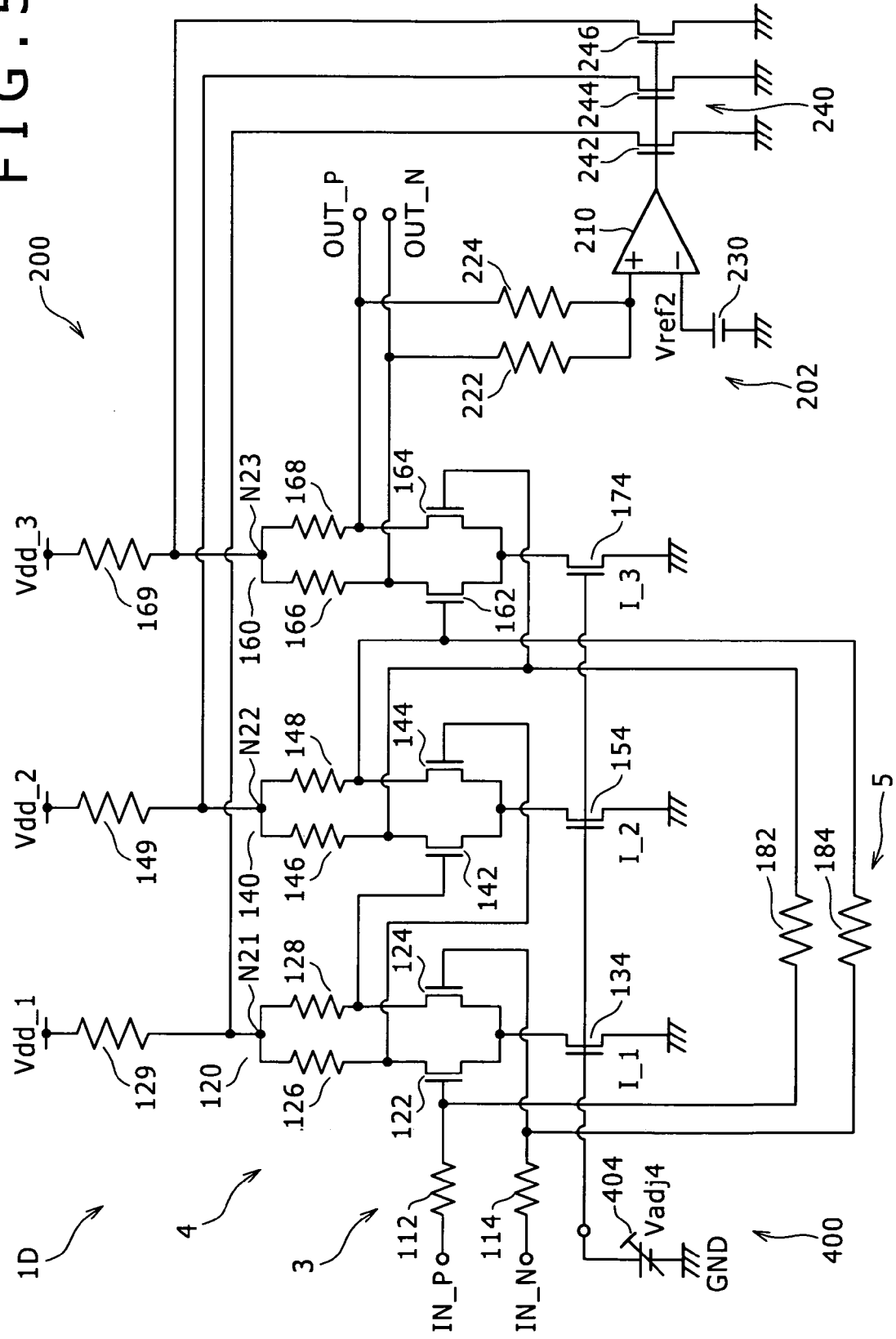
FIG. 5 is a circuit diagram showing a configuration of an amplifying circuit according to a fourth embodiment of the present invention.

FIG. 5 is a circuit diagram showing a configuration of an amplifying circuit according to a fourth embodiment of the present invention. The feature of the amplifying circuit 1D of the fourth embodiment is to add a gain adjusting function based on the amplifying circuit 1B of the second embodiment. Hereinafter, the amplifying circuit 1D of the fourth embodiment will be described by focusing on a difference from the amplifying circuit 1B of the second embodiment.

As shown in FIG. 5, in the amplifying circuit 1D of the fourth embodiment, the current sources 132, 152 and 172 of the amplifying circuit 1B are replaced with NMOS transistors 134, 154 and 174, respectively, and the reference voltage source 102 of the reference power source portion 6 of the amplifying circuit 1B is replaced with a variable voltage source 404. In a word, the reference power source portion 6 has one variable voltage source 404 which is common to a plurality stage of amplifying cells AS (120, 140 and 160). A gain adjusting circuit 400 is composed of the NMOS transistors 134, 154 and 174, and the variable voltage source 404.

Gate terminals of the NMOS transistors 134, 154 and 174 are each connected to a positive side one terminal of the variable voltage source 404, and thus an adjustment potential Vadj4 for adjustment of a current value is commonly supplied to the gate terminals of the NMOS transistors 134, 154 and 174. The NMOS transistors 134, 154 and 174 supply D.C. bias currents I_1, I_2 and I_3 (operating currents) each corresponding to the adjustment potential Vadj4 to the differential pairs, respectively. As understood from this, the NMOS transistors 134, 154 and 174 function as current source transistors for generating the operating currents for the amplifying cells AS (120, 140 and 160), respectively. For the purpose of optimizing the operating points and the mutual conductances in the respective stages, the D.C. bias current value is set every amplifying cell AS.

As estimated from the description given with respect to the setting of the reference potential Vref1 by the reference voltage source 102 in the amplifying circuit 1A of the first embodiment, when the adjustment potential Vadj4 is adjusted by the variable voltage source 404, the D.C. bias currents I_1, I_2 and I_3 for the respective differential pairs are adjusted, and thus the mutual conductances of the amplifying circuits 120, 140 and 160 are increased or decreased depending on the D.C. bias currents I_1, I_2 and I_3, respectively. In a word, the gains of the amplifying cells AS (120, 140 and 160) are determined depending on the set value of the adjustment potential Vadj4. Since each of the gains G1 and G2 of the amplifying circuits 120 and 140 in the first and second stages follows Expression (4) due to the presence of the D.C. feedback portion 5, even when the gains G1 and G2 of the amplifying cells AS (120, 140 and 160) are changed, no gain is substantially changed in terms of the respective feedback amplifying circuit. However, when the adjustment potential Vadj4 is adjusted by the variable voltage source 404, the amplification gain G3 of the amplifying cell 160 in the final stage is increased or decreased depending on the D.C. bias current I_3. Therefore, the gain of the amplifying circuit 1D can be controlled.

At this time, as estimated from the description given with respect to the setting of the D.C. bias current by the reference voltage source 102 in the amplifying circuit 1A of the first embodiment, when the D.C. bias currents are changed by adjusting the adjustment potential Vadj4 so as to obtain the necessary mutual conductances, amounts of voltage drop across the load resistors are changed in accordance with the increase or decrease of the D.C. bias currents, so that the operating points (bias voltages) of the differential output signals are attempting to be changed. In a word, if this goes on, an output D.C. offset may be caused along with the gain adjustment.

However, the amplifying circuit 1D of the fourth embodiment includes the D.C. operating point controlling portion 202 in the stage next to the final stage based on the amplifying circuit 1B of the second embodiment. For this reason, the D.C. operating point controlling, portion 202 functions so as to cancel the output D.C. offset following the gain adjustment by the variable voltage source 404, whereby the negative feedback control is carried out in such a way that each of the operating point potentials Vo of the amplifying cell 160 in the final stage agrees with the reference potential Vref2. Even when the gain adjusting function obtained by adjusting the operating currents of the amplifying cells AS (120, 140 and 160) is used in combination, each of the operating points of the amplifying cells AS (120, 140 and 160) can be maintained constant.

Fifth Embodiment (Fourth Embodiment+Operating Current Setting Corresponding to Necessary Frequency Band)

Figure 6A:
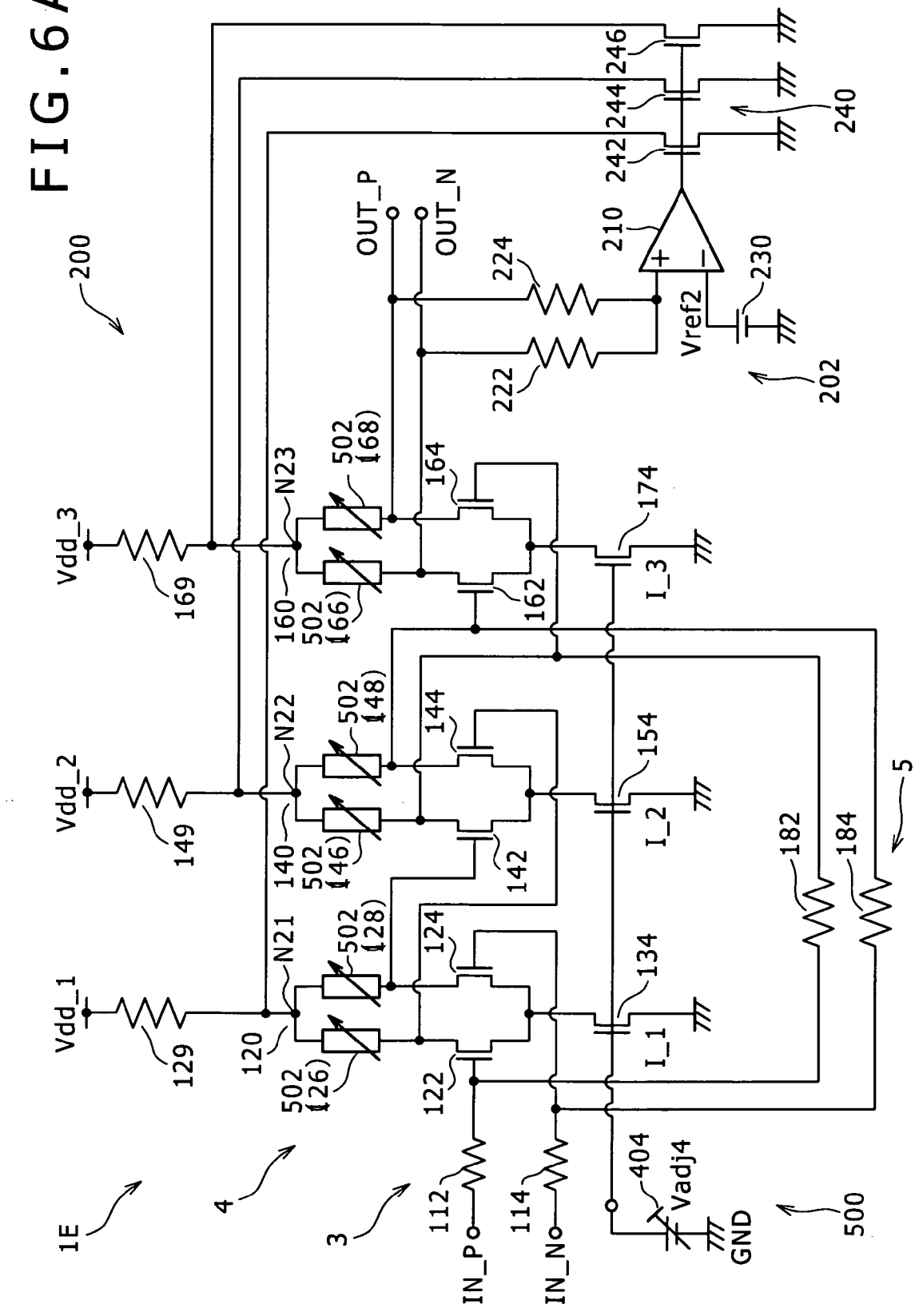
FIG. 6A is a circuit diagram showing a configuration of an amplifying circuit according to a fifth embodiment of the present invention.

FIGS. 6A to 6C, and 6D are respectively circuit diagrams, and a diagram explaining an amplifying circuit according to a fifth embodiment of the present invention. Here, FIG. 6A is a circuit diagram showing a configuration of the amplifying circuit of the fifth embodiment. FIGS. 6B and 6C are respectively a circuit diagram showing a configuration of an operating point voltage change correcting portion (a functional portion on a variable resistor circuit side) used in the amplifying circuit of the fifth embodiment, and a circuit diagram showing a configuration of the operating point voltage change correcting portion (a functional portion on a control circuit side) used in the amplifying circuit of the fifth embodiment. Also, FIG. 6D is a block diagram explaining an operation of the operating point voltage change correcting portion (the functional portion on the control circuit side).

The feature of the amplifying circuit 1E of the fifth embodiment is to add a function of switching the operating current over to another one in accordance with the necessary frequency band based on the amplifying circuit 1D of the fourth embodiment. Hereinafter, the amplifying circuit 1D of the fourth embodiment will be described by focusing on a difference from the amplifying circuit 1D of the fourth embodiment.

In the amplifying circuit 1E of the fifth embodiment, resistors 126 and 128, the resistors 146 and 148, and the resistors 166 and 168 on the load side of the amplifying cells AS (the amplifying cells 120, 140 and 160) in the first to third stages of the fourth embodiment are replaced with variable resistors 502 and 502, variable resistors 502 and 502, and variable resistors 502 and 502 in the first to third stages, respectively. In this configuration, these variable resistors 502 in the first to third stages can be changed in resistance values thereof in accordance with the necessary frequency band. In the case of the fifth embodiment, an operating current adjusting circuit 500 is composed of the NMOS transistors 134, 154 and 174, and the variable voltage source 404.

In addition, the amplifying circuit 1E of the fifth embodiment includes the operating point voltage change correcting portion 502. In this case, the operating point voltage change correcting portion 502 functions so as to correct (cancel) a change, of the output D.C. level (operating point voltage) of the amplifying cell AS, caused by a change of the operating current (D.C. bias current) adjusted by the operating current adjusting circuit 500.

The amplifying circuit 1E of the fifth embodiment is configured by changing the amplifying circuit 1D of the fourth embodiment. Thus, in principle, the load resistors 126, 128, 146, 148, 166, and 168, and the D.C. operating point adjusting elements 129, 149 and 169 in the amplifying circuit 1D of the fourth embodiment can become an object of the resistors on the load side. In the fifth embodiment, as shown in FIG. 6A, of the load resistors 126, 128, 146, 148, 166, and 168, and the D.C. operating point adjusting elements 129, 149 and 169, the load resistors 126, 128, 146, 148, 166, and 168 are changed into the variable resistor circuits. For example, when the operating current adjusting circuit 500 adjusts the operating current to the smaller values, the functional portion on the variable resistor circuit side of the operating point voltage change correcting portion 502 increases each of the values of the load resistors of the amplifying cell AS. On the other hand, when the operating current adjusting circuit 500 adjusts the operating current to the larger values, the functional portion on the variable resistor circuit side of the operating point voltage change correcting portion 502 decreases each of the values of the load resistors of the amplifying cell AS.

For realizing this operation, the functional portion on the variable resistor circuit side of the operating point voltage change correcting portion 502 adopts such a configuration that a plurality of series circuits each composed of a resistor 504 functioning as the load resistor, and a switching element 506 are connected in parallel with one another. Therefore, the resistance value of the operating point voltage change correcting portion 502 is changed in a phased manner so as to correspond to the frequency band. For example, as shown in FIG. 6B, three systems of series circuits are provided, and resistance values R504_1, R504_2 and R504_3 of resistors 504_1, 504_2 and 504_3 are set so as to meet a relationship of R504_1>R504_2>R504_3.

It is expected that a transistor switch of any one of the NMOS transistor or the PMOS transistor is used as the switching element 506. Or, it is also expected that the switching element 506 is configured in the form of a switch having a so-called transfer gate configuration in which the NMOS transistor and the PMOS transistor are connected in parallel with each other. Note that, the configuration of the operating point voltage change correcting portion 502 shown in FIG. 6B is merely an example. Thus, various kinds of change configurations such that in one system in FIG. 6B, the switching element 506 is removed away, and so forth may be adopted for the operating point voltage change correcting portion 502.

For changing the resistance values of the load resistors by the operating point voltage change correcting portion 502, it is considered that the changing of the resistance values of the load resistors is made to correspond to the adjustment for the D.C. bias currents I_1, I_2 and I_3 by the variable voltage source 404. By the way, with the configuration of the operating point voltage change correcting portion 502 shown in FIG. 6B, the resistance value is changed in a phased manner (in the three stages in the fifth embodiment), which actually copes with that consideration.

Basically, the changing of the resistance values of the load resistors is made to correspond to the adjustment for the adjustment potential Vadj4 by the variable voltage source 404, in a word, the adjustment for the D.C. bias currents I_1, I_2 and I_3. Thus, when the signal to be amplified has the narrow band, the resistance values of the load resistors 502 are increased to reduce the operating currents to be used. Contrary to this, when the signal to be amplified has the wide band, the resistance values of the load resistors 502 are reduced to increase the operating currents to be used. In addition, similarly, an input impedance Zo of the circuit connected to the next stage is made variable, thereby making it possible to control the operating currents in the manner following Expression (3).

For example, the functional portion on the control circuit side of the operating point voltage change correcting portion 502, as shown in FIG. 6C, includes a resistor ladder circuit 510, a voltage comparing portion 520, and a voltage judging portion 530. The resistor ladder circuit 510 has such a configuration that resistors 512, 514 and 516 are connected in series between a power source Vdd and the ground. Thus, a threshold value Th_1 is set at a connection point between the resistors 512 and 514, and a threshold value Th_2 (Th_1<Th_2) is set at a connection point between the resistors 514 and 516. The voltage comparing portion 520 includes a comparator 522 for comparing the adjustment potential Vadj4 with the threshold value Th_1, and a comparator 524 for comparing the adjustment potential Vadj4 with the threshold value Th_2 (Th_1<Th_2).

The voltage judging portion 530 includes a plurality of judgment output terminals (three judgment output terminals in the fifth embodiment) corresponding to a plurality of switching elements 506 (the three switching elements 506_1, 506_2 and 506_3 in the fifth embodiment), respectively. In this case, the three judgment output terminals are connected to control terminals CN_1, CN_2 and CN_3 of the three switching elements 506_1, 506_2 and 506_3 corresponding to the three judgment output terminals, respectively. The voltage judging portion 530 judges based on comparison results COMP_1 and COMP_2 which of Vadj4<Th_1, Th_1 Vadj4<Th_2, and Th_2≦Vadj4 is met, and turn ON only one of a plurality of switching elements (the three switching elements 506_1, 506_2 and 506_3 in the fifth embodiment).

When "Vadj4<Th_1" is met, each of the D.C. bias currents I_1, I_2 and I_3 is at a small level. When "Th_1≦Vadj4<Th_2" is met, each of the D.C. bias currents I_1, I_2 and I_3 is at a middle level. Also, when "Th_2≦Vadj4" is met, each of the D.C. bias currents I_1, I_2 and I_3 is at a larger level. As shown in the diagram of FIG. 6D, when it is no problem that the frequency band of the signal to be amplified is narrowest, the variable voltage source 404 operates so as to meet "Vadj4<Th_1" (each of the D.C. bias currents I_1, I_2 and I_3 is at the small level). In respond thereto, the voltage judging portion 530 turns ON only the switching element 506_1 to select the resistor 506_1 having the largest resistance value. When it is no problem that the frequency band of the signal to be amplified is about middle, the variable voltage source 404 operates so as to meet "Th_1≦Vadj4<Th_2" (each of the D.C. bias currents I_1, I_2 and I_3 is at the middle level). In respond thereto, the voltage judging portion 530 turns ON only the switching element 506_2 to select the resistor 506_2 having the middle resistance value. Also, when the frequency band of the signal to be amplified needs to be widest, the variable voltage source 404 operates so as to meet "Th_2≦Vadj4" (each of the D.C. bias currents I_1, I_2 and I_3 is at the large level). In respond thereto, the voltage judging portion 530 turns ON only the switching element 5063 to select the resistor 506_3 having the smallest resistance value.

In such a manner, in the amplifying circuit 1E of the fifth embodiment, the proper D.C. bias current following the necessary frequency band can be selected. As a result, it is possible to enhance the power consumption efficiency in the semiconductor chip or the system using the amplifying circuit 1E of the fifth embodiment.

2. Semiconductor Integrated Circuit

A semiconductor integrated circuit according to a sixth embodiment of the present invention includes: the amplifying cell portion 4 configured by cascade-connecting a plurality stage of amplifying cells 120, 140 and 160 each including a pair of NMOS transistors (e.g., 122 and 124) differentially connected to each other, the load resistors (e.g., 126 and 128) and the current source (e.g., 132) for generating the operating current, and each having the function of amplifying the differential signals; the D.C. feedback portion 5 for feeding differential output signals from the amplifying cell 140 in the rear stage side of the amplifying cell portion 4 back to differential input terminals of the amplifying cell 120 on the front stage side; the input portion 3 for supplying the differential input signals to the gate terminals of the amplifying cell 120 in the first stage of the amplifying cell portion 4; and a semiconductor substrate in which the amplifying cell portion 4, the D.C. feedback portion 5, and the input portion 3 are formed.

3. Wireless Transmission System

Figure 7:
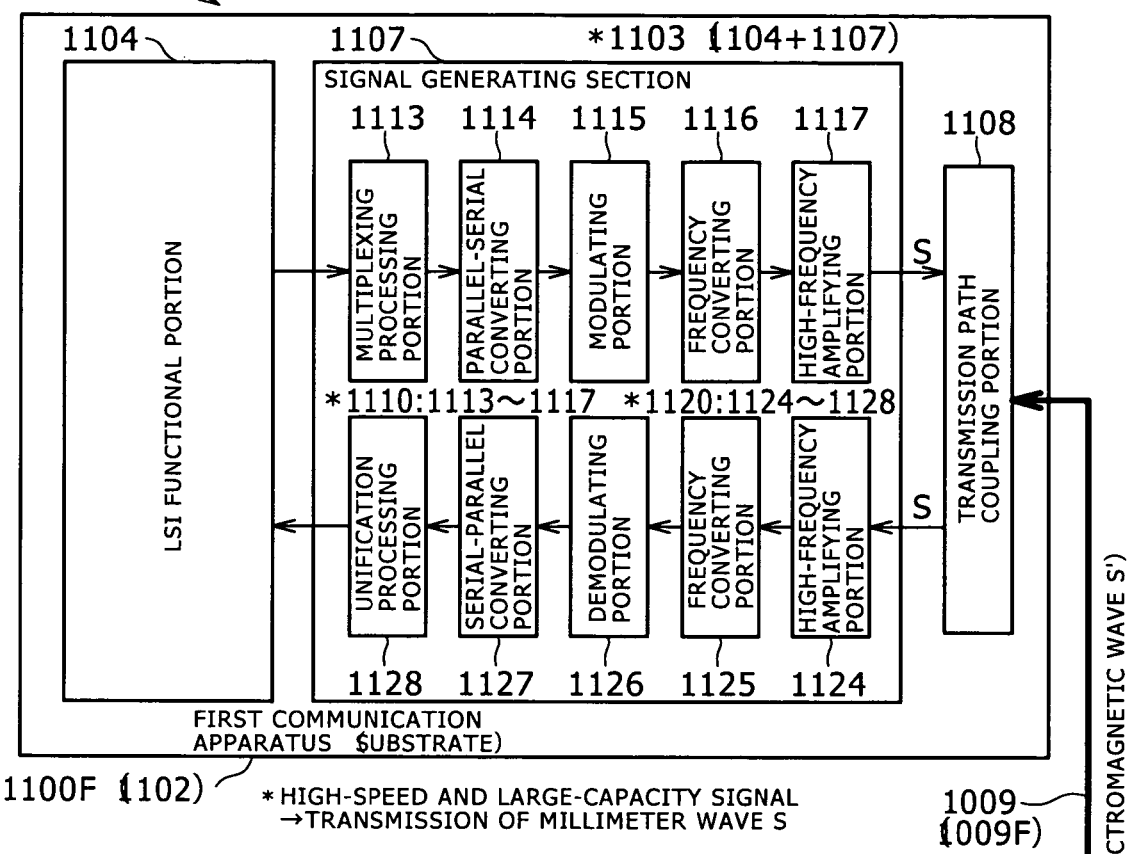
FIG. 7 is a block diagram explaining a signal interface in a wireless transmission system, to which the amplifying circuit is mounted, from a functional configuration side according to a seventh embodiment of the present invention.
Figure 7:
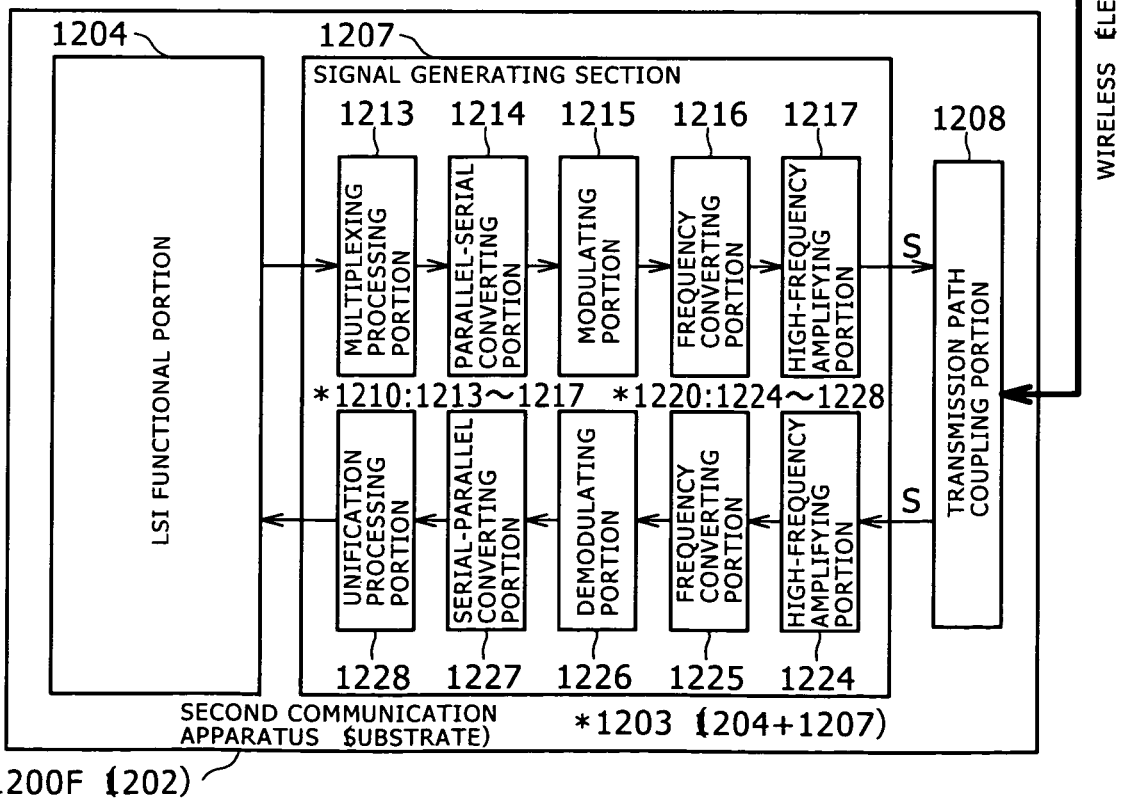

FIG. 7 and FIGS. 8A to 8D are respectively a block diagram, and graphical representations, a block diagram and a graphical representation explaining a wireless transmission system according to a seventh embodiment of the present invention. In this case, any one of the amplifying circuits 1A to 1E of the first to fifth embodiments described above is applied to the wireless transmission system 1001F. Here, FIG. 7 is the block diagram explaining a signal interface of the wireless transmission system 1001F of the seventh embodiment from a side of a functional configuration. FIGS. 8A to 8D are respectively the graphical representations, the block diagram and the graphical representation explaining multiplexing of signals in the wireless transmission system 1001F of the seventh embodiment.

Functional Configuration

As shown in FIG. 7, the wireless transmission system 1001F of the seventh embodiment is configured in such a way that a first communication apparatus 1100F as an example of a first wireless apparatus, and a second communication apparatus 1200F as an example of a second wireless apparatus are connected to each other through a millimeter wave signal transmission path 1009, thereby carrying out the signal transmission in a millimeter waveband. A signal as an object of transmission is frequency-converted into a millimeter wave signal in a millimeter waveband suitable for broadband transmission, and the resulting millimeter wave signal obtained through the frequency conversion is transmitted.

The first communication apparatus 1100F (first millimeter wave transmission apparatus) and the second communication apparatus 1200F (second millimeter wave transmission apparatus) compose the wireless transmission apparatus 1001F (system). Also, after the signal as the object of the transmission is frequency-converted into the millimeter wave signal, the resulting millimeter wave signal is transmitted between the first communication apparatus 1100F and the second communication apparatus 1200F which are disposed at a relatively short distance through the millimeter wave signal transmission path 1009. The wording "a wireless transmission" stated in the seventh embodiment means that the signal as the object of the transmission is not transmitted through an electric wiring, but is transmitted in the form of a millimeter wave.

The wording "the relatively short distance" means that the distance concerned is shorter than that between the communication apparatuses which are used in the broadcasting or the general wireless communication, and thus all is takes is that a transmission range is something capable of being substantially specified in the form of a closed space. For example, an inter-substrate communication within a chassis of an electronic apparatus, an inter-chip communication on the same substrate, or an inter-apparatus communication in a state in which a plurality of electronic apparatuses are integrated with one another as with the state in which the other electronic apparatus is mounted to one electronic apparatus corresponds to the communication at the relatively short distance in this case.

In the communication apparatuses provided across the millimeter wave signal path from each other, a transmission portion and a reception portion are disposed on a paired combination basis. The signal transmission between one communication apparatus and the other communication apparatus may be either one-way signal transmission or two-way signal transmission. For example, when the first communication apparatus 1100F becomes a transmission side, and the second communication apparatus 1200F becomes a reception side, a transmission portion is disposed in the first communication apparatus 1100F, and a reception portion is disposed in the second communication apparatus 1200F. On the other hand, when the second communication apparatus 1200F becomes the transmission side, and the first communication apparatus 1100F becomes the reception side, the transmission portion is disposed in the second communication apparatus, and the reception portion is disposed in the first communication apparatus 1100F.

The transmission portion, for example, includes a signal generating portion (a signal converting portion for converting an electric signal as an object of transmission into a millimeter wave signal) on the transmission side, and a signal coupling portion on the transmission side. In this case, the signal generating portion on the transmission side signal-processes the signal as the object of the transmission to generate the millimeter wave signal. The signal coupling portion on the transmission side couples the millimeter wave signal generated in the signal generating portion on the transmission side to a transmission path (millimeter wave signal transmission path) through which the millimeter wave signal is transmitted. Preferably, it is better that the signal generating portion on the transmission side is integrated with the functional portion for generating the signal as the object of the transmission.

For example, the signal generating portion on the transmission side includes a modulating circuit, and the modulating circuit modulates the signal as the object of the transmission. The signal generating portion on the transmission side frequency-converts the signal after having been modulated by the modulating circuit to generate the millimeter wave signal. In principle, it is also expected to directly convert the signal as the object of the transmission into the millimeter wave signal. The signal coupling portion on the transmission side supplies the millimeter wave signal generated by the signal generating portion on the transmission side to the millimeter wave signal transmission path.

On the other hand, the reception portion, for example, includes a signal coupling portion on the reception side, and a signal generating portion (a signal converting portion for converting a millimeter wave signal into an electric signal as an object of transmission) on the reception side. In this case, the signal coupling portion on the reception side receives the millimeter wave signal transmitted thereto through the millimeter wave signal transmission path. The signal generating portion on the reception side signal-processes the millimeter wave signal (input signal) received by the signal coupling portion on the reception side to generate the normal electric signal (the signal as the object of the transmission). Preferably, it is better that the signal generating portion on the reception side is integrated with the functional portion for receiving the signal as the object of the transmission. For example, the signal generating portion on the reception side includes a demodulating circuit, and frequency-converts the millimeter wave signal to generate an output signal. After that, the demodulating circuit demodulates the output signal to generate the signal as the object of the transmission. In principle, it is also expected to directly convert the millimeter wave signal into the signal as the object of the transmission.

In a word, for obtaining the signal interface, the signal as the object of the transmission is transmitted in the form of the millimeter wave signal on a contactless or cableless basis (not transmitted through the electric wiring). Preferably, at least the signal (especially, an image capturing signal for which high-speed transmission is required or a high-speed master clock signal) is transmitted in the form of the millimeter wave signal. In a word, the signal which has been transmitted through the electric wiring in the existing case is transmitted in the form of the millimeter wave signal in the seventh embodiment. By carrying out the signal transmission in the millimeter waveband, the signal transmission can be realized at a high speed on the order of Gbps, the extent of the millimeter wave signal can be readily limited, and the effect due to this property can be obtained.

Here, all it takes is that the signal coupling portions allow the millimeter wave signal to be transmitted between the first communication apparatus and the second communication apparatus through the millimeter wave signal transmission path. For example, the signal coupling portion either may include an antenna structure (antenna coupling portion) or may have the coupling without including the antenna structure.

Although "the millimeter wave signal transmission path through which the millimeter wave signal is transmitted" may be air (so-called free space), preferably, it is better that "the millimeter wave signal transmission path through which the millimeter wave signal is transmitted" has a construction through which the millimeter wave signal is transmitted while the millimeter wave signal is confined within the transmission path. By positively utilizing this property, the distribution of the millimeter wave signal transmission path can be arbitrarily decided as with, for example, the electric wiring.

It is better that a construction made of a dielectric material allowing the millimeter wave signal to be transmitted (referred to either as "a dielectric transmission path" or as "an intra-millimeter wave dielectric transmission path"), or a hollow waveguide is used as such a constriction. In this case, in the hollow waveguide, a shielding material which composes the transmission path and serves to suppress the external radiation of the millimeter wave signal is provided so as to surround the transmission path. Also, the inside of the shielding material is hollow. The dielectric material or the shielding material is given the flexibility, thereby making it possible to distribute the millimeter wave signal transmission path.

By the way, in the case of the air (so-called free space), each of the signal coupling portions adopts the antenna structure, and the signal is transmitted between the antenna structures disposed at the short distance through the space. On the other hand, although when the construction is made of the dielectric material, the antenna structure can also be adopted, this adoption is not essential.

Hereinafter, a configuration of the wireless transmission system according to the seventh embodiment of the present invention will be concretely described.

A semiconductor chip 1103 with which the communication can be carried out in the millimeter waveband is provided in the first communication apparatus 1100F. A semiconductor chip 1203 with which the communication can be carried out in the millimeter waveband is provided in the second communication apparatus 1200F as well.

In the seventh embodiment, the signal becoming an object of a communication in the millimeter waveband is limited only to a signal for which a high-speed property and a large-capacity property are required. Thus, other signals which are enough even in a low-speed property and a small-capacity property, and a signal, from a power source or the like, which is regarded as a D.C. signal are each not made an object of conversion into the millimeter wave signal. With regard to these signals (including the D.C. signal from the power source) each of which is not made the object of the conversion into the millimeter wave signal, similarly to the existing case, the substrates are connected to each other through the electric wiring. It is noted that the original electric signals each as the object of the transmission before having been converted into the millimeter waves are collectively referred to as "a baseband signal."

First Communication Apparatus

In the first communication apparatus 1100F, a semiconductor chip 1103 with which the communication can be carried out in the millimeter waveband, and a transmission path coupling portion 1108 are both mounted on a substrate 1102. The semiconductor chip 1103 is a system Large Scale Integrated Circuit (LSI) in which an LSI functional portion 1104 and a signal generating section 1107 (millimeter wave signal generating portion) are integrated with each other. Although not illustrated, a configuration may also be adopted such that the LSI functional portion 1104 and the signal generating section 1107 are not integrated with each other. When the LSI functional portion 1104 and the signal generating section 1107 are provided separately from each other, with regard to the signal transmission between the LSI functional portion 1104 and the signal generating section 1107, a problem caused by transmitting the signal through the electric wiring is feared. Therefore, it is preferable to integrate the LSI functional portion 1104 and the signal generating section 1107 with each other.

The signal generating section 1107 and the transmission path coupling portion 1108 are made to adopt a configuration having the two-way property of the data. For this reason, a signal generating portion on the transmission side, and a signal generating portion on the reception side are both provided in the signal generating section 1107. Although the transmission path coupling portion 1108 may be provided in each of the transmission side and the reception side, in the seventh embodiment, the transmission coupling portion 1108 is used for the reception as well as the transmission.

It is noted that "the two-way communication" stated herein becomes single-conductor two-way transmission in which the millimeter wave signal transmission path 1009 as a transmission channel for a millimeter wave is one system (single-conductor). A half-duplex system to which Time Division Duplex (TDD) is applied, Frequency Division Duplex (FDD: refer to FIGS. 8A, 8B and 8D), or the like is applied to the realization for "the two-way. communication."

Figure 8A:
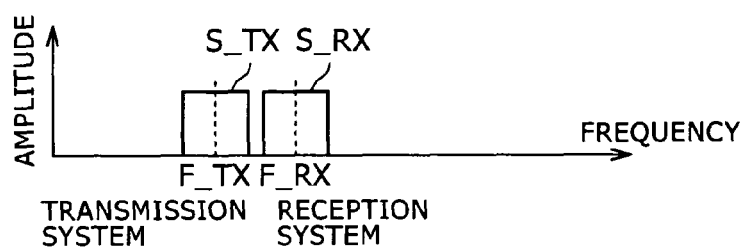
FIGS. 8A and 8B, 8C, and 8D are respectively graphical representations, a block diagram, and a graphical representation explaining multiplexing of signals in the wireless transmission system of the seventh embodiment shown in FIG. 7.

In the case of the time division duplex, the separation of the transmission and the reception is carried out in a time division manner. Thus, "the simultaneity of the two-way communication (single-conductor simultaneous two-way transmission)" in which the signal transmission from the first communication apparatus 1100F to the second communication apparatus 1200F, and the signal transmission from the second communication apparatus 1200F to the first communication apparatus 1100F are simultaneously carried out is not realized, but the single-conductor simultaneous two-way transmission is realized by utilizing the frequency division duplex. As shown in FIG. 8A, however, since in the frequency division duplex, different frequencies are used between the transmission and the reception, a transmission bandwidth of the millimeter signal transmission path 1009 needs to be widened.

The semiconductor chip 1103 is not directly mounted on the substrate 1102, but the semiconductor chip 1103 may be mounted on an interposer substrate, and a semiconductor package in which the semiconductor chip 1103 is molded with a resin (such as an epoxy resin) may be mounted on the substrate 1102 instead. That is to say, in this case, the interposer substrate composes a substrate for chip mounting, and the semiconductor chip 1103 is provided on the interposer substrate. All it takes is that a sheet member obtained by, for example, combining a heat reinforcement resin having a relative permittivity in the given region (of about 2 to about 10), and a copper foil with each other is used as the interposer substrate.

The semiconductor 1103 is connected to the transmission path coupling portion 1108. An antenna structure, for example, including an antenna coupling portion, an antenna terminal, a micro-strip line, an antenna and the like is applied to the transmission path coupling portion 1108. It is noted that by applying a technique for directly forming the antenna in the chip, the transmission path coupling portion 1108 can also be incorporated in the semiconductor chip 1103.

The LSI functional portion 1104 carries out main application control for the first communication apparatus 1100F. Thus, for example, the LSI functional portion 1104 includes a circuit for processing various kinds of signals which are described to be transmitted to the other party, and a circuit for processing various kinds of signals which are received from the other party.

The signal generating section 1107 (electric signal converting portion) converts the signal supplied from the LSI functional portion 1104 into the millimeter wave signal, and carries out the control for the signal transmission through the millimeter wave signal transmission path 1009.

Specifically, the signal generating section 1107 includes a transmission-side signal generating portion 1110 and a reception-side signal generating portion 1120. The transmission portion is composed of the transmission-side signal generating portion 1110 and the transmission path coupling portion 1108, and the reception portion is composed of the reception-side signal generating portion 1120 and the transmission path coupling portion 1108.

For the purpose of signal-processing the input signal to generate the millimeter wave signal, the transmission side signal generating portion 1110 includes a multiplexing processing portion 1113, a parallel-serial converting portion 1114, a modulating portion 1115, a frequency converting portion 1116, and a high-frequency amplifying portion 1117. It is noted that the modulating portion 1115 and the frequency converting portion 1116 may be collected into one portion complying with a so-called direct conversion system.

For the purpose of signal-processing the millimeter wave electric signal received by the transmission path coupling portion 1108 to generate the output signal, the reception-side signal generating portion 1120 includes a high-frequency amplifying portion 1124, a frequency correcting portion 1125, a demodulating portion 1126, a serial-parallel converting portion 1127, and a unification processing portion 1128.

The frequency correcting portion 1125 and the demodulating portion 1126 may be collected into one portion complying with the so-called direct conversion system.

The parallel-serial converting portion 1114 and the serial-parallel converting portion 1127 are both prepared for the case of a parallel interface specification using a plurality of signals for parallel transmission when the wireless transmission system 1001F of the seventh embodiment is not applied. Thus, the parallel-serial converting portion 1114 and the serial-parallel converting portion 1127 are both unnecessary in the case of a serial interface specification.

When there are a plurality kind of signals (which are taken to be N kinds of signals) each an object of communication in the millimeter waveband of the signals supplied from the LSI functional portion 1104, the multiplexing processing portion 1113 executes multiplexing processing such as the time division duplex, the frequency division duplex or the code division duplex, thereby collecting a plurality kind of signals into one system of signal. In the case of the seventh embodiment, a plurality kind of signals for each of which the high-speed property and the large-capacity property are both required are each made an object of transmission carried out in the form of the millimeter wave, and are collected into one system of signal.

In the case of the time division duplex or the code division duplex, all it takes is that the multiplexing processing portion 1113 is provided in a preceding stage of the parallel-serial converting portion 1114, and collects a plurality of signals supplied from the LSI functional portion 1104 into one system of signal which is in turn supplied to the parallel-serial converting portion 1114. In the case of the time division duplex, all it takes is that there is provided a change-over switch for finely dividing a time with respect to a plurality kind of signals _@ ((@: 1 to N), thereby supplying a plurality kind of signals _@ to the parallel-serial converting portion 1114 on the time division basis.

Figure 8B:
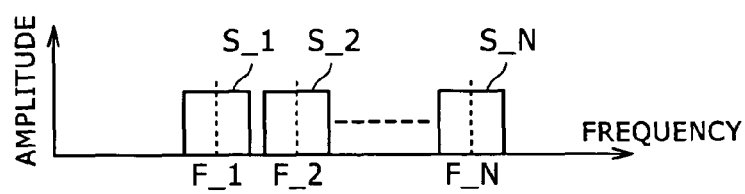
Figure 8C:
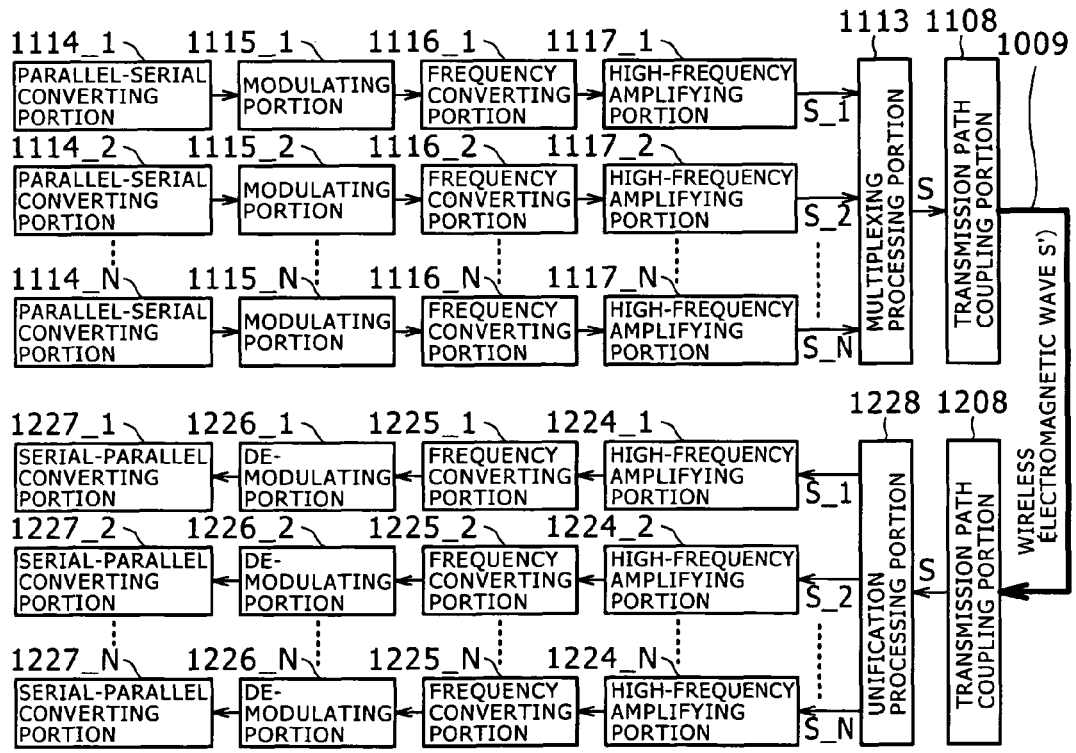

On the other hand, in the case of the frequency division duplex, as shown in FIG. 8B, frequencies in frequency bands F_@ different from one another needs to be obtained through the frequency conversion, thereby generating signals in the millimeter waveband. For this reason, for example, as shown in FIG. 8C, all it takes is that the parallel-serial converting portion 1114, the modulating portions 1115, the frequency converting portion 1116, and the high-frequency amplifying portions 1117 are provided so as to correspond to a plurality kind of signals _@, and an addition processing portion as the multiplexing processing portion 1113 is provided in a subsequent stage of each of the high-frequency amplifying portions 1117 (1117_1, 1117_2, . . . , 1117_N). Also, all it takes is that a millimeter wave electric signal in a frequency band of F_1+ . . . +F_N after completion of the frequency multiplexing processing is supplied to the transmission path coupling portion 1108.

Figure 8D:
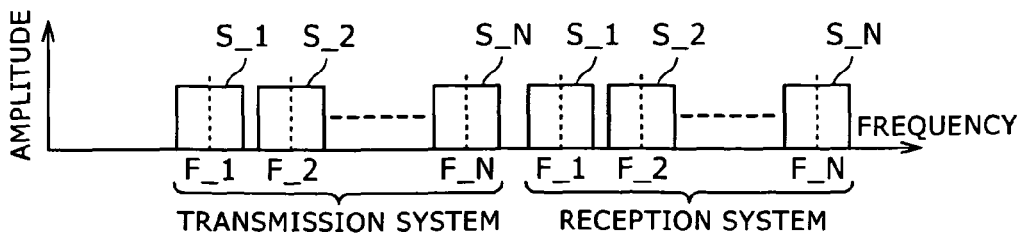

As can been seen from FIG. 8B, in the case of the frequency division duplex through which a plurality system of signals are collected into one system of signal, the transmission bandwidth needs to be widened. When as shown in FIG. 8D, collecting a plurality system of signals into one system of signal through the frequency division duplex, and the full-duplex system in which different frequencies are used between the transmission and the reception are used in combination with each other, the transmission bandwidth needs to be further widened.

The parallel-serial converting portion 1114 converts a parallel signal into a serial data signal, and supplies the resulting serial data signal to the modulating portion 1115. The modulating portion 1115 is one which modulates the signal as the object of the transmission, and supplies the resulting signal to the frequency converting portion 1116. All it takes is that the modulating portion 1115 modulates at least one of an amplitude, a frequency, and a phase with the signal as the object of the transmission. Also, a system of an arbitrary combination of modulations about the amplitude, the frequency and the phase can also be adopted. For example, in the case of an analog modulation system, for example, there are Amplitude Modulation (AM) and vector modulation. With regard to the vector modulation, there are Frequency Modulation (FM) and Phase Modulation (PM). On the other hand, in the case of a digital modulation system, for example, there are Amplitude Shift Keying (ASK), Frequency Shift Keying (FSK), Phase Shift Keying (PSK), and Amplitude Phase Shift Keying (APSK) for modulating both an amplitude and a phase. The amplitude phase modulation is typified by Quadrature Amplitude Modulation (QAM).

The frequency converting portion 1116 frequency-modulates a signal as an object of transmission after having been modulated by the modulating portion 1115 to generate a millimeter wave electric signal which is in turn supplied to the high-frequency amplifying portion 1117. The millimeter wave electric signal points to an electric signal having a frequency in the range of about 30 to about 300 GHz. The reason for describing "about" in the frequency range is based on the fact that such a frequency as to obtain the effect by the millimeter wave communication in the seventh embodiment is available, and a lower limit is not limited to 30 GHz and an upper limit is not limited to 300 GHz.

Although various kinds of circuit configurations can be adopted for the frequency converting portion 1116, for example, all it takes is that a configuration including a mixer circuit and a local oscillator is adopted. The local oscillator generates a carrier (a carrier signal or a reference carrier) used for the modulation. The mixer circuit multiples (modulates) a carrier in the millimeter waveband generated by the local oscillator by the signal supplied from the parallel-serial converting portion 1114 to generate a modulated signal in the millimeter waveband, and supplies the resulting modulated signal to the high-frequency amplifying portion 1117.

The amplifying circuit 1 of any one of the first to fifth embodiments described above is applied to the high-frequency amplifying portion 1117 on the transmission side. In this configuration, the high-frequency amplifying portion 1117 is also contained in the semiconductor chip 1103 as an example of the semiconductor integrated circuit (IC). The high-frequency amplifying portion 1117 amplifies the millimeter wave electric signal after having been frequency-converted, and supplies the millimeter wave electric signal thus amplified to the transmission path coupling portion 1108. The high-frequency amplifying portion 1117 is connected to the two-way transmission path coupling portion 1108 through an antenna terminal (not shown).

The transmission path coupling portion 1108 transmits the millimeter wave signal generated by the transmission-side signal generating portion 1110 to the millimeter wave signal transmission path 1009. Also, the transmission path coupling portion 1108 receives the millimeter wave signal from the millimeter wave signal transmission path 1009, and outputs the millimeter wave signal to the reception side signal generating portion 1120.

The transmission path coupling portion 1108 is composed of an antenna coupling portion. The antenna coupling portion composes either an example or part of the transmission path coupling portion 1108 (signal coupling portion). The antenna coupling portion narrowly points to a portion in which an electronic circuit formed within the semiconductor chip, and an antenna disposed either inside or outside the semiconductor chip are coupled to each other, and broadly points to a portion in which the semiconductor chip and the millimeter wave signal transmission path 1009 are signal-coupled to each other. For example, the antenna coupling portion includes at least the antenna structure. In addition, when the transmission or reception is carried out on the time division duplex basis, an antenna switching portion (antenna duplexer) is provided in the transmission path coupling portion 1108.

The antenna structure points to a structure in the coupling portion with the millimeter wave signal transmission path 1009. Thus, all it takes is that the electric signal in the millimeter waveband is coupled to the millimeter wave signal transmission path 1009 through the antenna structure, and thus the antenna structure does not mean only the antenna itself. For example, the antenna structure includes an antenna terminal, a micro-strip line, and an antenna. When the antenna switching portion is formed within the same semiconductor chip, the antenna terminal and the micro-strip line other than the antenna switching portion compose the transmission path coupling portion 1108.

The antenna has a length based on a wavelength, A, (for example, about 600 μm) of the millimeter wave signal, and is coupled to the millimeter wave signal transmission path 1009. In addition to a patch antenna, a probe antenna (such as a dipole), a loop antenna, a small aperture coupling element (such as a slot antenna) or the like is used as the antenna.

When the antenna on the first communication apparatus 1100F side, and the antenna on the second communication apparatus 1200F side are disposed so as to be opposite to each other, these antennas may be nondirectional ones. When the antenna on the first communication apparatus 1100F side, and the antenna on the second communication apparatus 1200F side are disposed so as to be planarly shifted, all it takes is that these antennas are directional ones, or a device is carried out in such a way that a dielectric transmission path for changing a travel direction from a thickness direction of a substrate to a planar direction, or causing the millimeter wave signal to travel in the planar direction by utilizing a reflecting member is provided, and so forth.

The antenna on the transmission side radiates an electromagnetic wave based on the millimeter wave signal to the millimeter wave signal transmission path 1009. In addition, the antenna on the reception side receives the electromagnetic wave based on the millimeter wave signal from the millimeter wave signal transmission path 1009. The micro-strip line is connected between the antenna terminal and the antenna, and transmits the millimeter wave signal on the transmission side from the antenna terminal to the antenna, and transmits the millimeter wave signal on the reception side from the antenna to the antenna terminal.

The antenna switching portion. is used when the antenna is used for the reception as well as for the transmission. For example, when the millimeter wave signal is transmitted to the second communication apparatus 1200F side as the other party, the antenna switching portion connects the antenna to the transmission-side signal generating portion 1110. On the other hand, when the millimeter wave signal is received from the second communication apparatus 1200F side as the other party, the antenna switching portion connects the antenna to the reception-side signal generating portion 1120. Although the antenna switching portion is provided on the substrate 1102 separately from the semiconductor chip 1103, the present invention is by no means limited thereto, and thus the antenna switching portion may be formed within the semiconductor chip 1103. When the antenna for transmission, and the antenna for the reception are provided separately from each other, the antenna switching portion can be omitted.

Although the millimeter wave signal transmission path 1009 as a propagation path for the millimeter wave may be a free space transmission path, preferably, the millimeter wave signal transmission path 1009 is structured in the form of a waveguide structure such as a waveguide, a transmission path, a dielectric line or an intra-dielectric transmission path. Also, the millimeter wave signal transmission path 1009 has the characteristics allowing the electromagnetic wave in the millimeter waveband to be efficiently transmitted. For example, it is better that the millimeter wave signal transmission path 1009 is structured in the form of a dielectric transmission path 1009F structured so as to contain a dielectric material having a relative permittivity in a given range, and a dielectric dissipation factor in a given range.

With regard to "a given range," all it takes is that the relative permittivity or the dielectric dissipation factor of the dielectric material falls within such a range as to obtain the effect of the seventh embodiment, and thus has a predetermined value in this sense. In a word, all it takes is that the dielectric material is one which has such characteristics as to obtain the effect of the seventh embodiment, and with which the millimeter wave can be transmitted. Although the characteristics are not necessarily, clearly determined because the characteristics cannot be determined by the dielectric material itself, and are also related not only to the transmission path length, but also to the frequency of the millimeter wave, the characteristics are described as an example as follows.

For the purpose of transmitting the millimeter wave signal through the dielectric transmission path 1009F at a high speed, it is preferable that the relative permittivity of the dielectric material is in the range of about 2 to about 10 (preferably, in the range of 3 to 6), and the dielectric dissipation factor of the dielectric material is in the range of about 0.00001 to about 0.01 (preferably, in the range of 0.00001 to 0.001). A dielectric material, for example, made of an acrylic resin system, an urethane resin system, an epoxy resin system, a silicon system, a polyimide system, or a cyanoacrylate resin system can be used as the dielectric material meeting such conditions. Such ranges of the relative permittivity and the dielectric dissipation factor of the dielectric material also apply to the seventh embodiment unless a notice is especially made. It is noted that in addition to the dielectric transmission path 1009F, a hollow waveguide in which the circumference of the transmission path is surrounded by a shielding material, and an inside of which is hollow may also be used as the millimeter wave signal transmission path 1009 in which the millimeter wave signal is confined within the transmission path.

A reception-side signal generating portion 1120 is connected to the transmission path coupling portion 1108. For the purpose of signal-processing the millimeter wave electric signal received by the transmission path coupling portion 1108 to generate an output signal, the reception-side signal generating portion 1120 includes a high-frequency amplifying portion 1124, a frequency converting portion 1125, a demodulating portion 1126, a serial-parallel converting portion 1127, and a unification processing portion 1128. It is noted that the frequency converting portion 1125 and the demodulating portion 1126 may be collected into one portion complying with the so-called direct conversion system.

Any one of the amplifying circuits 1A to 1E of the first to fifth embodiments is applied to the high-frequency amplifying portion 1124 on the reception side. In this configuration, the high-frequency amplifying portion 1124 is contained in a semiconductor chip 1203 as an example of the semiconductor integrated circuit (IC) of the sixth embodiment. The high-frequency amplifying portion 1124 is connected to the transmission path coupling portion 1108. Thus, the high-frequency amplifying portion 1124 amplifies the millimeter wave electric signal after having been received by the antenna, and supplies the millimeter wave electric signal thus amplified to the frequency converting portion 1125. The frequency converting portion 1125 frequency-converts the millimeter wave electric signal after having been amplified, and supplies the millimeter wave electric signal thus frequency-converted to the demodulating portion 1126. The demodulating portion 1126 demodulates the signal after having been frequency-converted to acquire a signal in a base-band, and supplies the signal in the base-band thus acquired to the serial-parallel converting portion 1127.

The serial-parallel converting portion 1127 converts the serial received data into parallel output data, and supplies the resulting parallel output data to the unification processing portion 1128.

The unification processing portion 1128 corresponds to the multiplexing processing portion 1113, and separates the one system of signal obtained through the collection into a plurality kind of signals $\_@_{(@)}$ 1 to N). In the case of the seventh embodiment, for example, a plurality kind of data signals which are collected into one system of signal are separated into the individual data signals, and supplies the individual data signals to the LSI functional portion 1104.

It is noted that when a plurality kind of data signals are collected into one system of signal on the frequency division duplex basis, the millimeter wave electric signal in the frequency band of $F\_1+ \ldots +F\_N$ after completion of the frequency duplex processing needs to be received to be processed so as to correspond to the frequency bands $F\_@$, respectively. For this reason, all it takes is that as shown in. FIG. 8C, high-frequency amplifying portions 1224, frequency converting portions 1225, demodulating portions 1226, and serial-parallel converting portions 1227 are provided so as to correspond to a plurality kind of signals $\_@$, respectively, and a frequency separating portion is provided as a unification processing portion 1228 in a preceding stage of each of the high-frequency amplifying portions 1224 (1224_1, 1224_2, . . . , 1224_N). Also, all it takes is that the millimeter wave electric signals in the respective frequency bands $F\_@$ after completion of the separation are supplied to the systems in the frequency bands $F\_@$, respectively.

When the semiconductor chip 1103 is configured in the manner described above, the input signal is subjected to parallel-serial conversion to be transmitted to the semiconductor chip 1203 side. Also, the received signal from the semiconductor chip 1203 is subjected to serial-parallel conversion, thereby reducing the number of signals each as the object of the millimeter wave conversion.

When the original signal transmission between the first communication apparatus 1100F and the second communication apparatus 1200F complies with the serial format, both the parallel-serial converting portion 1114 and the serial-parallel converting portion 1127 may not be provided.

Second Communication Apparatus

The second communication apparatus 1200F has approximately the same function and configuration as those of the first communication apparatus 1100F. The individual functional portions are designated by reference numerals of 1200s, respectively, and the functional portions identical or similar to those in the first communication apparatus 1100F are designated by the same reference numeral as those in the first communication apparatus 1100F, i.e., reference numerals 10s and 1s, respectively. A transmission portion is composed of a transmission side signal generating portion 1210 and a transmission path coupling portion 1208, and a reception portion is composed of a reception side signal generating portion 1220 and the transmission path coupling portion 1208.

The LSI functional portion 1204 carries out main application control for the second communication apparatus 1200F. Thus, the LSI functional portion 1204 includes a circuit for processing various kinds of signals which are desired to be transmitted to the other party, and a circuit for processing various kinds of signals which are received from the other party.

Here, a technique for frequency-converting an input signal, and transmitting a resulting signal is generally used in the broadcasting and the wireless communication. In these use applications, there are used the relatively complicated transmitter, receiver and the like which can cope with problems such as α) how far the communication can be carried out (a problem about an S/N ratio against a thermal noise), β) how the configuration copes with the reflection and the multi-path, γ) how a hindrance and an interference with other channels are suppressed, and so on. On the other hand, each of the signal generating sections 1107 and 1207 used in the wireless transmission system 1001F of the seventh embodiment is used in a millimeter waveband and having frequencies each of which is higher than the use frequency in the relatively complicated transmitter, receiver and the like generally used in the broadcasting and the wireless communication, and also a wavelength, λ, is shorter. Therefore, the frequencies are easy to reutilize, and thus each of the signal generating sections 1107 and 1207 is suitably for communications among many devices each two disposed in a short distance.

Connection and Operation

In the seventh embodiment, unlike the signal interface utilizing the existing electric wiring, the signal transmission is carried out in the millimeter waveband as described above, thereby making it possible to flexibly respond to both the high-speed property and the large-capacity property. For example, only the signal for which the high-speed property and the large-capacity property are both required is made the object of the communication in the millimeter waveband. Thus, each of the first communication apparatus 1100F and the second communication apparatus 1200F partially includes the interface (the connection by the terminal and the connector) by the existing electric wiring in order to respond to the signal having both the low-speed property and the small-capacity property, and the supply of the power source voltage.

The signal generating section 1107 signal-processes the input signal inputted thereto from the LSI functional portion 1104 to generate the millimeter wave signal. The signal generating section 1107 is connected to the transmission path coupling portion 1108 through the transmission line such as the micro-strip line, a strip line, a coplanar line or a slot line. Thus, the resulting millimeter wave signal is supplied to the millimeter wave signal transmission path 1009 through the transmission path coupling portion 1108.

The transmission path coupling portion 1108 has the antenna structure, and has the function of converting the millimeter wave signal transmitted thereto into the electromagnetic wave, and sending the resulting electromagnetic wave. The transmission path coupling portion 1108 obtained through the conversion is coupled to the millimeter wave signal transmission path 1009, and thus the resulting electromagnetic wave in the transmission path coupling portion 1108 is supplied to one end portion of the millimeter wave signal transmission path 1009. The transmission path coupling portion 1208 on the second communication apparatus 1200F side is coupled to the other end portion of the millimeter wave signal transmission path 1009. The millimeter wave signal transmission path 1009 is provided between the transmission path coupling portion 1108 on the first communication apparatus 1100F side and the transmission path coupling portion 1208 on the second communication apparatus 1200F side, so that the electromagnetic wave in the millimeter waveband is propagated through the millimeter wave signal transmission path 1009.

The transmission path coupling portion 1208 on the second communication apparatus 1200F side is coupled to the millimeter wave signal transmission path 1009. The transmission path coupling portion 1208 receives the electromagnetic wave transmitted to the other end portion of the millimeter wave signal transmission path 1009, converts the electromagnetic wave thus received into the millimeter wave signal, and supplies the resulting millimeter wave signal to the signal generating section 1207 (base-band signal generating portion). The signal generating section 1207 signal-processes the millimeter wave signal obtained through the conversion to generate the output signal (base-band signal), and supplies the resulting output signal to the LSI functional portion 1204.

Although in this case, the description has been given with respect to the case of the signal transmission from the first communication apparatus 1100F to the second communication apparatus 1200F, the case where the signal supplied from the LSI functional portion 1204 of the second communication apparatus 1200F is transmitted to the first communication apparatus 1100F may be similarly considered. Thus, the millimeter wave signal can be transmitted bidirectionally.

For example, the signal transmission system in which the signal is transmitted through the electric wiring involves the following problems.

i) Although the large capacity and the increased high speed of the transmission data are both required, there is a limit to the transmission speed and the transmission capacity of the electric wiring.

ii) It is expected that for the purpose of coping with the problem about the increased high speed of the transmission data, the number of wirings is increased, and thus the transmission speed per one signal line is reduced by parallelization of signals. However, this case leads to an increase of the number of input/output terminals. As a result, there are required the complexity of the printed wiring board and the cable wiring, the increase of each of the physical sizes of the connector portion and the electric interface, and the like. Thus, there is caused a problem that the shapes of the printed wiring board and the cable wiring, and the connector portion and the electric interface are complicated, the reliabilities thereof are reduced, and the cost is increased.

iii) A problem about the electromagnetic compatibility (EMC) is further actualized as the band of the base-band signal becomes wider along with the increased enormousness of an amount of information such as a film and a video, and a computer image. For example, when the electric wiring is used, the wiring acts as the antenna, and thus the signal corresponding to the tuning frequency of the antenna is interfered. In addition, the factors caused by the reflection and the resonance due to the mismatching or the like of the impedance of the wiring also cause the unnecessary radiation. When the resonance and the reflection are caused, the radiation is easy to follow the resonance and the reflection, and thus a problem about an electromagnetic induction failure (EMI) also becomes serious. In order to cope with such a problem, the configuration of the electronic apparatus is completed.

iv) In addition to the EMC and the EMI, when the reflection is caused, the transmission error due to the interference between the symbols, and the transmission error due to the unsolicited hindrance also becomes a problem on the reception side.

On the other hand, the wireless transmission system 1001F of the seventh embodiment carries out the signal transmission by using the millimeter wave without using the electric wiring. The signal intended to be transmitted from the LSI functional portion 1104 to the LSI functional portion 1204 is converted into the millimeter wave signal, and the resulting millimeter wave signal is transmitted between the transmission path coupling portions 1108 and 1208 through the millimeter wave transmission path 1009.

Owing to the wireless transmission, it is unnecessary to worry about the wiring shape and the position of the connector. Therefore, a limit to the layout is not generated so much. Since for the signal which is transmitted in the form of the millimeter wave instead of being transmitted through the electric wiring, the wiring and the terminal can be omitted. As a result, the problems about the EMC and the EMI are solved. In general, any of functional portions each using the frequency in the millimeter base-band does not exist somewhere else in the insides of the first and second communication apparatuses 1100F and 1200F. As a result, the measures taken to cope with the EMC and the EMI can be readily realized.

The following advantages are obtained because of the wireless transmission in the state in which the first communication apparatus 1100F and the second communication apparatus 1200F are disposed in a short distance, and of the signal transmission between the fixed positions and related to the known positional relationship.

1) It is easy to properly design the propagation channel (waveguide structure) between the transmission side and the reception side.

2) The dielectric structure of the transmission path coupling portion which seals the transmission side and the reception side, and the propagation channel (the waveguide structure of the millimeter wave signal transmission path 1009) are designed in combination with each other, whereby the transmission which is higher reliable and more excellent than that of the free space transmission becomes possible.

3) The control by the controller (the LSI functional portion 1104 in the seventh embodiment) for managing the wireless transmission also needs not to be dynamically, adaptively and frequently carried out as with the general wireless communication. Therefore, the overhead by the control can be reduced as compared with the general wireless communication. As a result, the miniaturization, the low power consumption and the high-speed operation become possible.

4) When the wireless transmission environment is corrected in the phase of the manufacture and in the phase of the design, and the dispersion and the like of the individual constituent elements are grasped, the transmission is carried out by referring to the resulting data, thereby making it possible to carry out the communication of the higher grade.

5) Even when the reflection exists, the influence of the reflection can be readily removed on the reception side by using a small equalizer because of the fixed reflection. The setting of the equalizer also can be carried out in accordance with the preset or the static control, and thus is easy to realize.

In addition, the following advantages are obtained because of the millimeter wave communication.

a) Since the communication band is widely obtained in the millimeter wave communication, it is possible to simply obtain the large data rate.

b) The frequencies used in the transmission can be each separated from other frequencies for the base-band signal processing. Thus, the interference in frequency between the millimeter wave and the base-band signal is hardly caused, and thus the space division duplex which will be described later is easy to realize.

c) Since the wavelength is short in the millimeter waveband, it is possible to miniaturize the antenna and the waveguide structure each depending on the wavelength. In addition thereto, the electromagnetic shielding is easy to carry out because the distance attenuation is large and the difference is less.

d) In the wireless communication in the normal field, the severe regulations are set for the stability of the carrier in order to prevent the interference or the like. For the purpose of realizing such a carrier having the high stability, outside frequency standard parts or components, a multiplying circuit, a phase-locked loop (PLL) circuit, and the like each having the high stability are used, and thus the circuit scale becomes large. However, in the millimeter wave (especially, in the phase of being combined with the signal transmission between the fixed positions, or related to the known positional relationship), the millimeter wave can be readily shielded, and can be prevented from being leaked to the outside. Also, the carrier having the low stability can be used in the transmission and the increase of the circuit scale can be suppressed. In order to demodulate the signal which is transmitted with the carrier having the lowered stability by the small circuit on the reception side, the injection-locked system is preferably adopted.

It is noted that although in the seventh embodiment, the wireless transmission system 1001F for carrying out the communication in the millimeter waveband is exemplified as the wireless transmission system to which the amplifying circuit 1 of any one of the first to fifth embodiments is applied, the application range of the amplifying circuit 1 of any one of the first to fifth embodiments is by no means limited to the communication in the millimeter waveband. That is to say, the amplifying circuit 1 of any one of the first to fifth embodiments may also be applied as each of amplifying circuits in a transmission portion and/or a reception portion for communication in a frequency band falling below the millimeter waveband, for example, a UWB or a frequency band equal to or lower than the UWB, or contrary to this, in a frequency band exceeding the millimeter waveband.

4. Communication Apparatus on Transmission Side

A communication apparatus on a transmission side according to an eighth embodiment of the present invention includes: the signal generating portion 1110, 1210 on the transmission side for signal-processing the signal as the object of the transmission to generate the millimeter wave signal; the high-frequency amplifying portion 1117, 1217 for amplifying the millimeter wave signal generated in the signal generating portion 1110, 1210 on the transmission side; and the transmission path coupling portion 1108, 1208 on the transmission side for coupling the millimeter wave signal amplified in the high-frequency amplifying portion 1117, 1217 to the millimeter wave signal transmission path 1009 through which the millimeter wave signal is transmitted. In this case, the high-frequency amplifying portion 1117, 1217 includes: the amplifying cell portion 4 configured by cascade-connecting a plurality stage of amplifying cells 120, 140 and 160 each including a pair of NMOS transistors (e.g., 122 and 124) differentially connected to each other, the load resistors (e.g., 126 and 128) and the current source (e.g., 132) for generating the operating current, and each having the function of amplifying the differential signals; the D.C. feedback portion 5 for feeding differential output signals from the amplifying cell 140 in the rear stage side of the amplifying cell portion 4 back to differential input terminals of the amplifying cell 120 on the front stage side; the input portion 3 for supplying the differential millimeter wave signal generated in the signal generating portion 1110, 1210 on the transmission side as an input signal to the gate terminals of the amplifying cell 120 in the first stage of the amplifying cell portion 4.

5. Communication Apparatus on Reception Side

A communication apparatus on a reception side according to ninth embodiment of the present invention includes: the transmission path coupling portion 1108, 1208 on the reception side for receiving the millimeter wave signal transmitted through the millimeter wave signal transmission path 1009; the high-frequency amplifying portion 1117, 1217 for amplifying the millimeter wave signal received in the transmission path coupling portion 1108, 1208 on the reception side; and the signal generating portion 1120, 1220 on the reception side for signal-processing the millimeter wave signal amplified in the high-frequency amplifying portion 1117, 1217 to generate the signal as the object of the transmission. In this case, the high-frequency amplifying portion 1117, 1217 includes: the amplifying cell portion 4 configured by cascade-connecting a plurality stage of amplifying cells 120, 140 and 160 each including a pair of NMOS transistors (e.g., 122 and 124) differentially connected to each other, the load resistors (e.g., 126 and 128) and the current source (e.g., 132) for generating the operating current, and each having the function of amplifying the differential signals; the D.C. feedback portion 5 for feeding differential output signals from the amplifying cell 140 in the rear stage side of the amplifying cell portion 4 back to differential input terminals of the amplifying cell 120 on the front stage side; the input portion 3 for supplying the millimeter wave signal received in the transmission path coupling portion 1108, 1208 on the reception side as an input signal to the gate terminals of the amplifying cell 120 in the first stage of the amplifying cell portion 4.

6. Communication Apparatus

A communication apparatus according to a tenth embodiment of the present invention includes: the transmission portion including the signal generating portion 1110, 1210 on the transmission side for signal-processing the signal as the object of the transmission to generate the transmission signal, and the high-frequency amplifying portion 1117, 1217 on the transmission side for amplifying the transmission signal generated in the signal generating portion 1110, 1210 on the transmission side; and/or a reception portion including the high-frequency amplifying portion 1124, 1224 on the reception side for amplifying the received signal, and the signal generating portion 1120, 1220 on the reception side for signal-processing the received signal amplified in the high-frequency amplifying portion 1124, 1224 on the reception side to generate the signal as the object of the transmission. In this case, the high-frequency amplifying portion 1124, 1224 includes: the amplifying cell portion 4 configured by cascade-connecting a plurality stage of amplifying cells 120, 140 and 160 each including a pair of NMOS transistors (e.g., 122 and 124) differentially connected to each other, the load resistors (e.g., 126 and 128) and the current source (e.g., 132) for generating the operating current, and each having the function of amplifying the differential signals; the D.C. feedback portion 5 for feeding differential output signals from the amplifying cell 140 in the rear stage side of the amplifying cell portion 4 back to differential input terminals of the amplifying cell 120 on the front stage side; the input portion 3 for supplying the differential millimeter wave signal generated in the signal generating portion 1110, 1210 on the transmission side as an input signal to the gate terminals of the amplifying cell 120 in the first stage of the amplifying cell portion 4.

The present application contains subject matter related to that disclosed in Japanese Priority Patent Application JP 2009-174964 filed in the Japan Patent Office on Jul. 28, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An amplifying circuit, comprising:
    an amplifying cell portion configured by cascade-connecting a plurality stage of amplifying cells each including a pair of N-type transistors differentially connected to each other, load resistors and a current source for generating an operating current, and each having a function of amplifying differential signals;
    a feedback portion configured to feed differential output signals from the amplifying cell in a rear stage side of said amplifying cell portion back to differential input terminals of the amplifying cell on a front stage side; and
    an input portion configured to supply differential input signals to input terminals in a first stage of said amplifying cell portion.

2. The amplifying circuit according to claim 1, wherein said input portion includes resistors corresponding to the differential signals, respectively, on a signal path, and said feedback portion includes resistors corresponding to the differential signals, respectively, on said signal path.

3. The amplifying circuit according to claim 1, wherein said feedback portion feeds the differential output signals from the amplifying cell in the final stage in said amplifying cell portion to differential input terminals of the amplifying cell in the first stage through the D.C. coupling.

4. The amplifying circuit according to claim 1, further comprising:
    an operating point voltage stabilizing circuit for monitoring each of operating point voltages of the differential outputs from the amplifying cell, and carrying out control in such a way that each of the operating point voltages is held constant based on monitoring result.

5. The amplifying circuit according to claim 4, wherein said operating point voltage stabilizing circuit comprises:
    D.C. operating point adjusting elements provided between said load resistors and power sources on a high potential side;
    a D.C. operating point controlling portion including monitoring elements for monitoring the operating point voltages of the differential output signals from the amplifying cell, respectively, a reference voltage source for generating a reference voltage, and a comparing portion configured to compare the operating point voltages of the differential output signals from the amplifying cell monitored by said monitoring elements, respectively, with a reference voltage generated by said reference voltage source; and
    a current driving portion configured to cause D.C. currents to flow through said D.C. operating point adjusting elements, respectively, in accordance with an output signal from said comparing portion.

6. The amplifying circuit according to claim 5, wherein the D.C. operating point adjusting elements are provided for said plurality stage of amplifying cells, respectively;

said D.C. operating point controlling portion is commonly provided for said plurality stage of amplifying cells;

said current driving portion has a plurality of driving transistors for causing currents to flow through said D.C. operating point adjusting elements, respectively, provided for said plurality stage of amplifying cells, respectively; and said D.C. operating point controlling portion monitors the operating point voltages of the differential output signals from said amplifying cell in the final stage by said monitoring elements, and drives said driving transistors provided for said plurality stage of amplifying cells, respectively, in accordance with a result obtained by comparing the operating point voltages thus monitoring with the reference voltage generated by said reference voltage source in said comparing portion.

7. The amplifying circuit according to claim 4, further comprising:
a gain adjusting circuit for adjusting a gain by adjusting a value of the operating current generated from the current source of the amplifying cell.

8. The amplifying circuit according to claim 7, wherein said gain adjusting circuit comprises:
one variable voltage source adapted to change an adjustment potentials for adjustment for the values of the operating currents and provided commonly to said plurality stage of amplifying cells; and
a plurality of current source transistors each generating an operating current having a magnitude corresponding to the adjustment potential generated by said one variable voltage source, and provided for said plurality stage of amplifying cells, respectively.

9. The amplifying circuit according to claim 1, further comprising:
a parasitic capacitance correcting circuit for correcting a parasitic capacitance generated in an output side of the amplifying cell.

10. The amplifying circuit according to claim 9, wherein said parasitic capacitance correcting circuit comprises:
a pair of transistors having control input terminals connected to differential output terminals of the amplifying cell, an output terminal and said control input terminal of one of said pair of transistors being cross-connected to said control input terminal and an output terminal of the other of said pair of transistors, respectively;
a pair of current sources connected to the other output terminals of said pair of transistors cross-connected to each other, respectively, for supplying operating currents to said pair of transistors, respectively; and
a pair of correcting capacitors connected in parallel with said pair of current sources.

11. The amplifying circuit according to claim 1, further comprising:
an operating current adjusting circuit for adjusting a value of the operating current generated by the current source of the amplifying cell; and
an operating point voltage change correcting portion configured to correct a change of the operating point voltage of the amplifying cell following the adjustment of the operating current by said operating current adjusting circuit.

12. The amplifying circuit according to claim 11, wherein when said operating current adjusting circuit adjusts the value of the operating current to smaller values, said operating point voltage change correcting portion increases values of the load resistors of said amplifying cells; and when said operating current adjusting circuit adjusts the value of the operating current to larger values, said operating point voltage change correcting portion reduces values of the load resistors of said amplifying cells.

13. A semiconductor integrated circuit, comprising:
an amplifying cell portion configured by cascade-connecting a plurality stage of amplifying cells each including a pair of N-type transistors differentially connected to each other, load resistors and a current source for generating an operating current, and each having a function of amplifying differential signals;
a feedback portion configured to feed differential output signals from said amplifying cell in a rear stage side of said amplifying cell portion back to differential input terminals of said amplifying cell on a front stage side;
an input portion configured to supply differential input signals to input terminals in a first stage of said amplifying cell portion; and
a semiconductor substrate in which said amplifying cell portion, said feedback portion, and said input portion are formed.

14. A wireless transmission system, comprising:
a first communication apparatus;
a second communication apparatus; and
a millimeter wave signal transmission path through which information is adapted to be transmitted between said first communication apparatus and said second communication apparatus in a millimeter waveband, and
each of said first communication apparatus and said second communication apparatus having an amplifying circuit including
an amplifying cell portion configured by cascade-connecting a plurality stage of amplifying cells each including a pair of N-type transistors differentially connected to each other, load resistors and a current source for generating an operating current, and each having a function of amplifying differential signals,
a feedback portion configured to feed differential output signals from said amplifying cell in a rear stage side of said amplifying cell portion back to differential input terminals of said amplifying cell on a front stage side, and
an input portion configured to supply differential input signals to input terminals in a first stage of said amplifying cell portion,
wherein said first communication apparatus converts a signal as an object of transmission into a millimeter wave signal and amplifies the resulting millimeter wave signal in said amplifying circuit, and transmits the resulting millimeter wave signal thus amplified to said second communication apparatus through said millimeter wave signal transmission path, or said second communication apparatus receives the millimeter wave signal from said first communication apparatus through said millimeter wave signal transmission path and amplifies the millimeter wave signal in said amplifying circuit, and demodulates the millimeter wave signal thus amplified into the signal as the object of the transmission.

15. A communication apparatus on a transmission side, comprising:
a signal generating portion on the transmission side configured to signal-process a signal as an object of transmission to generate a millimeter wave signal;
an amplifying portion configured to amplify the millimeter wave signal generated in said signal generating portion on the transmission side; and a signal coupling portion on the transmission side configured to couple the millimeter wave signal amplified in said amplifying portion to a millimeter wave signal transmission path through which a millimeter wave signal is transmitted, and said amplifying portion including an amplifying cell portion configured by cascade-connecting a plurality stage of amplifying cells each including a pair of N-type transistors differentially connected to each other, load resistors and a current source for generating an operating current, and each having a function of amplifying differential signals, a feedback portion configured to feed differential output signals from said amplifying cell in a rear stage side of said amplifying cell portion back to differential input terminals of said amplifying cell on a front stage side, and an input portion configured to supply the differential millimeter wave signal generated in said signal generating portion on the transmission side as an input signal to input terminals in a first stage of said amplifying cell portion.

16. A communication apparatus on a reception side, comprising:

a signal coupling portion on the reception side configured to receive a millimeter wave signal transmitted through a millimeter wave signal transmission path;

an amplifying portion configured to amplify the millimeter wave signal received in said signal coupling portion on the reception side; and a signal generating portion on the reception side configured to signal-process the millimeter wave signal amplified in said amplifying portion to generate a signal as an object of transmission, and said amplifying portion including an amplifying cell portion configured by cascade-connecting a plurality stage of amplifying cells each including a pair of N-type transistors differentially connected to each other, load resistors and a current source for generating an operating current, and each having a function of amplifying differential signals, a feedback portion configured to feed differential output signals from said amplifying cell in a rear stage side of said amplifying cell portion back to differential input terminals of said amplifying cell on a front stage side, and an input portion configured to supply the millimeter wave signal received in said signal coupling portion on the reception side as an input signal to input terminals in a first stage of said amplifying cell portion.

17. A communication apparatus, comprising:

a transmission portion including a signal generating portion on a transmission side configured to signal-process a signal as an object of transmission to generate a transmission signal, and an amplifying portion on the transmission side configured to amplify the transmission signal generated in said signal generating portion on the transmission side; and a reception portion including an amplifying portion on a reception side configured to amplify a received signal, and a signal generating portion on the reception side configured to signal-process the received signal amplified in said amplifying portion on the reception side to generate the signal as the object of the transmission, and said amplifying portion including an amplifying cell portion configured by cascade-connecting a plurality stage of amplifying cells each including a pair of N-type transistors differentially connected to each other, load capacitors and a current source for generating an operating current, and each having a function of amplifying differential signals, a feedback portion configured to feed differential output signals from said amplifying cell in a rear stage side of said amplifying cell portion back to differential input terminals of said amplifying cell on a front stage side, and an input portion configured to supply the differential millimeter wave signal generated in said signal generating portion on the transmission side as an input signal to input terminals in a first stage of said amplifying cell portion.

18. A communication apparatus, comprising:

a transmission portion including a signal generating portion on a transmission side configured to signal-process a signal as an object of transmission to generate a transmission signal, and an amplifying portion on the transmission side configured to amplify the transmission signal generated in said signal generating portion on the transmission side; or a reception portion including an amplifying portion on a reception side configured to amplify a received signal, and a signal generating portion on the reception side configured to signal-process the received signal amplified in said amplifying portion on the reception side to generate the signal as the object of the transmission, and said amplifying portion including an amplifying cell portion configured by cascade-connecting a plurality stage of amplifying cells each including a pair of N-type transistors differentially connected to each other, load capacitors and a current source for generating an operating current, and each having a function of amplifying differential signals, a feedback portion configured to feed differential output signals from said amplifying cell in a rear stage side of said amplifying cell portion back to differential input terminals of said amplifying cell on a front stage side, and an input portion configured to supply the differential millimeter wave signal generated in said signal generating portion on the transmission side as an input signal to input terminals in a first stage of said amplifying cell portion.

19. A communication apparatus on a transmission side, comprising:

signal generating means on the transmission side for signal-processing a signal as an object of transmission to generate a millimeter wave signal;

amplifying means for amplifying the millimeter wave signal generated in said signal generating portion on the transmission side; and a signal coupling portion on the transmission side for coupling the millimeter wave signal amplified in said amplifying portion to a millimeter wave signal transmission path through which a millimeter wave signal is transmitted, and said amplifying means including an amplifying cell portion configured by cascade-connecting a plurality stage of amplifying cells each including a pair of N-type transistors differentially connected to each other, load resistors and a current source for generating an operating current, and each having a function of amplifying differential signals, a feedback portion configured to feed differential output signals from said amplifying cell in a rear stage side of said amplifying cell portion back to differential input terminals of said amplifying cell on a front stage side, and an input portion configured to supply the differential millimeter wave signal generated in said signal generating portion on the transmission side as an input signal to input terminals in a first stage of said amplifying cell portion.

20. A communication apparatus on a reception side, comprising:
- signal coupling means on the reception side for receiving a millimeter wave signal transmitted through a millimeter wave signal transmission path;
- amplifying means for amplifying the millimeter wave signal received in said signal coupling portion on the reception side; and
- signal generating means on the reception side for signal-processing the millimeter wave signal amplified in said amplifying portion to generate a signal as an object of transmission, and
- said amplifying means including
  - an amplifying cell portion configured by cascade-connecting a plurality stage of amplifying cells each including a pair of N-type transistors differentially connected to each other, load resistors and a current source for generating an operating current, and each having a function of amplifying differential signals,
  - a feedback portion configured to feed differential output signals from said amplifying cell in a rear stage side of said amplifying cell portion back to differential input terminals of said amplifying cell on a front stage side, and
  - an input portion configured to supply the millimeter wave signal received in said signal coupling portion on the reception side as an input signal to input terminals in a first stage of said amplifying cell portion.

* * * * *